United States Patent
Shimizu et al.

(10) Patent No.: US 9,859,201 B2
(45) Date of Patent: Jan. 2, 2018

(54) WIRING SUBSTRATE, SEMICONDUCTOR DEVICE, AND METHOD FOR MANUFACTURING WIRING SUBSTRATE

(71) Applicant: SHINKO ELECTRIC INDUSTRIES CO., LTD., Nagano-Ken (JP)

(72) Inventors: Noriyoshi Shimizu, Nagano (JP); Kiyoshi Oi, Nagano (JP); Yuichiro Shimizu, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 28 days.

(21) Appl. No.: 14/730,743

(22) Filed: Jun. 4, 2015

(65) Prior Publication Data
US 2015/0357276 A1 Dec. 10, 2015

(30) Foreign Application Priority Data
Jun. 10, 2014 (JP) ................................ 2014-119592

(51) Int. Cl.
*H01L 23/498* (2006.01)
*H01L 21/48* (2006.01)
(Continued)

(52) U.S. Cl.
CPC ...... *H01L 23/49838* (2013.01); *H01L 21/486* (2013.01); *H01L 21/4857* (2013.01);
(Continued)

(58) Field of Classification Search
CPC ......... H01L 23/49811; H01L 23/49822; H01L 23/49827; H01L 25/40652; H01L 25/0655;
(Continued)

(56) References Cited

U.S. PATENT DOCUMENTS 5,488,542 A * 1/1996 Ito .................. H01L 23/5385
174/259
2004/0235287 A1* 11/2004 Inoue .................. H01L 21/4846
438/612
(Continued)

FOREIGN PATENT DOCUMENTS

JP H 05251864 9/1993
JP H 10163634 6/1998
(Continued)

OTHER PUBLICATIONS

Notification of Reasons for Rejection; JP Patent Appln. No. 2014-119592; Sep. 26, 2017; 7 pages.

*Primary Examiner* — Ishwarbhai B Patel
*Assistant Examiner* — Paresh Paghadal
(74) *Attorney, Agent, or Firm* — Fish & Richardson P.C.

(57) ABSTRACT

A wiring substrate includes a first wiring structure and a second wiring structure stacked thereon. The first wiring structure includes a first insulation layer and a via wiring extending through the first insulation layer. The second wiring structure includes a first wiring layer formed on the first insulation layer and the via wiring, and a first plane layer stacked on the first insulation layer and at least partially grid-shaped in a plan view to define second through holes. A second insulation layer is stacked on the first insulation layer to fill the second through holes and cover the first plane layer and the first wiring layer. The second wiring structure has a higher wiring density than the first wiring structure. The second through holes each include a lower open end and an upper open end having a smaller open width than the lower open end.

9 Claims, 24 Drawing Sheets

(51) Int. Cl.
  *H05K 1/03* (2006.01)
  *H05K 1/09* (2006.01)
  *H05K 1/18* (2006.01)
  *H05K 3/00* (2006.01)

(52) U.S. Cl.
  CPC .. *H01L 23/49822* (2013.01); *H01L 23/49827* (2013.01); *H05K 1/0306* (2013.01); *H05K 1/0326* (2013.01); *H05K 1/0346* (2013.01); *H05K 1/09* (2013.01); *H05K 1/181* (2013.01); *H05K 3/0023* (2013.01); *H05K 3/0055* (2013.01); *H05K 3/0094* (2013.01); *H01L 23/49833* (2013.01); *H01L 2224/16225* (2013.01); *H01L 2224/32225* (2013.01); *H01L 2224/73204* (2013.01); *H01L 2924/15174* (2013.01); *H01L 2924/15311* (2013.01); *H05K 2201/0141* (2013.01); *H05K 2201/0154* (2013.01); *Y10T 29/49167* (2015.01)

(58) Field of Classification Search
  CPC ......... H01L 25/105; H01L 2224/16225; H01L 2224/32225; H01L 2224/73205; H01L 2225/06517; H05K 3/4644
  See application file for complete search history.

(56) References Cited

U.S. PATENT DOCUMENTS

| | | | |
|---|---|---|---|
| 2005/0167842 A1* | 8/2005 | Nakamura | H01L 23/522 257/758 |
| 2008/0138576 A1* | 6/2008 | Nozu | B32B 18/00 428/138 |
| 2011/0121445 A1* | 5/2011 | Mori | H01L 23/5389 257/693 |
| 2011/0198114 A1* | 8/2011 | Maeda | H01L 23/49811 174/257 |
| 2012/0049368 A1* | 3/2012 | Tanaka | H01L 23/49822 257/741 |
| 2014/0174808 A1* | 6/2014 | Zhang | H05K 1/113 174/261 |
| 2014/0182889 A1* | 7/2014 | Shin | H05K 3/4673 174/251 |

FOREIGN PATENT DOCUMENTS

| | | |
|---|---|---|
| JP | H 11238970 | 8/1999 |
| JP | 2000058986 | 2/2000 |
| JP | 2003-023252 | 1/2003 |
| JP | 2003-023253 | 1/2003 |
| JP | 2013030516 | 2/2013 |

* cited by examiner

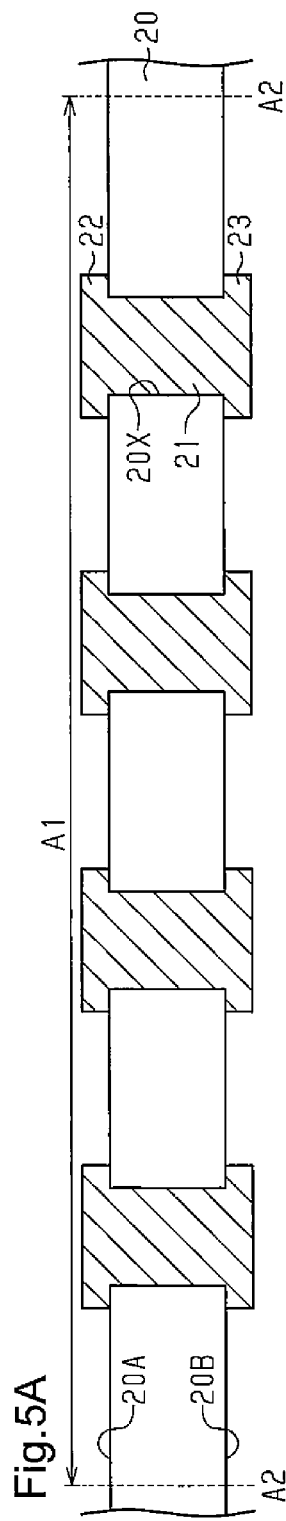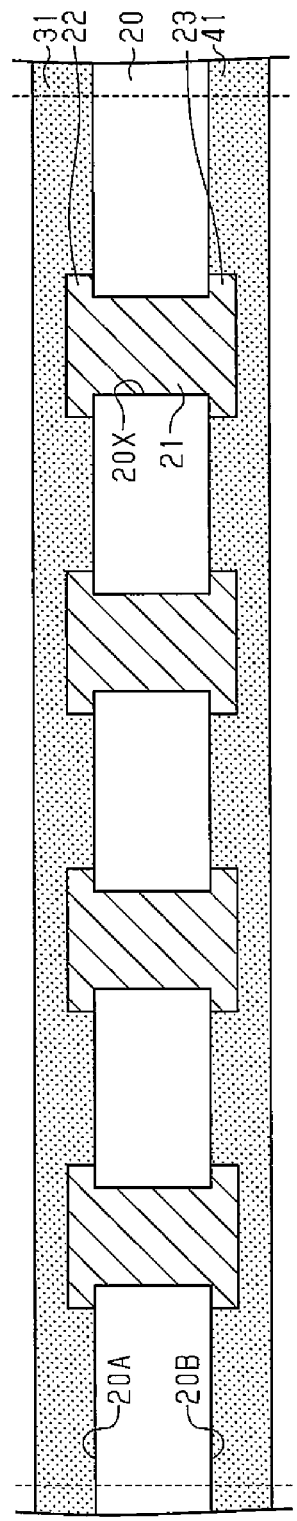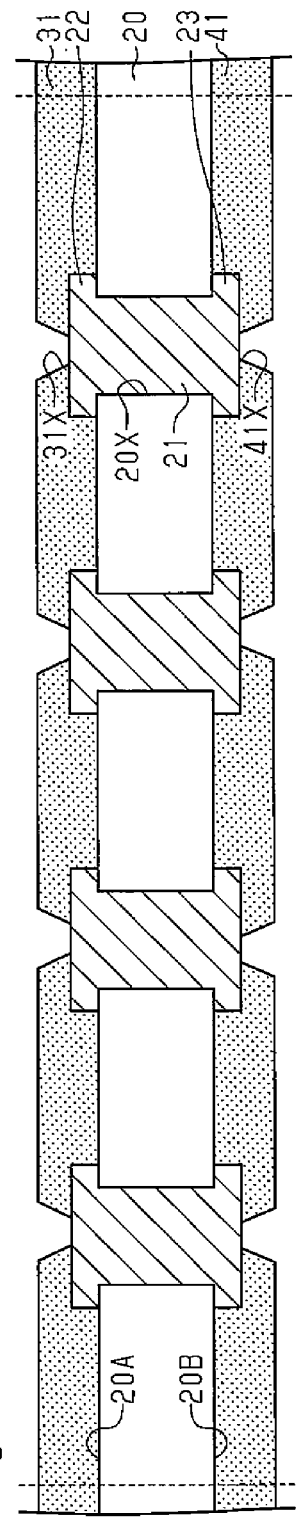

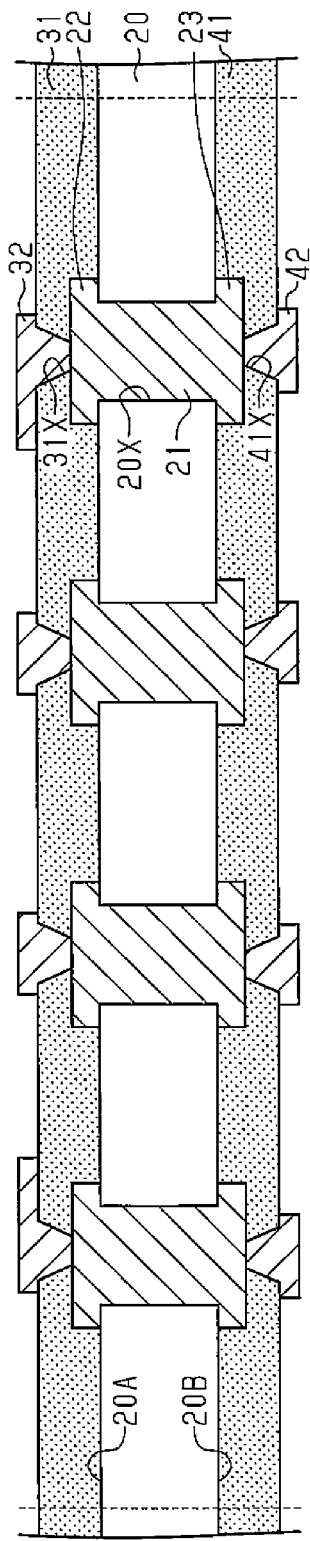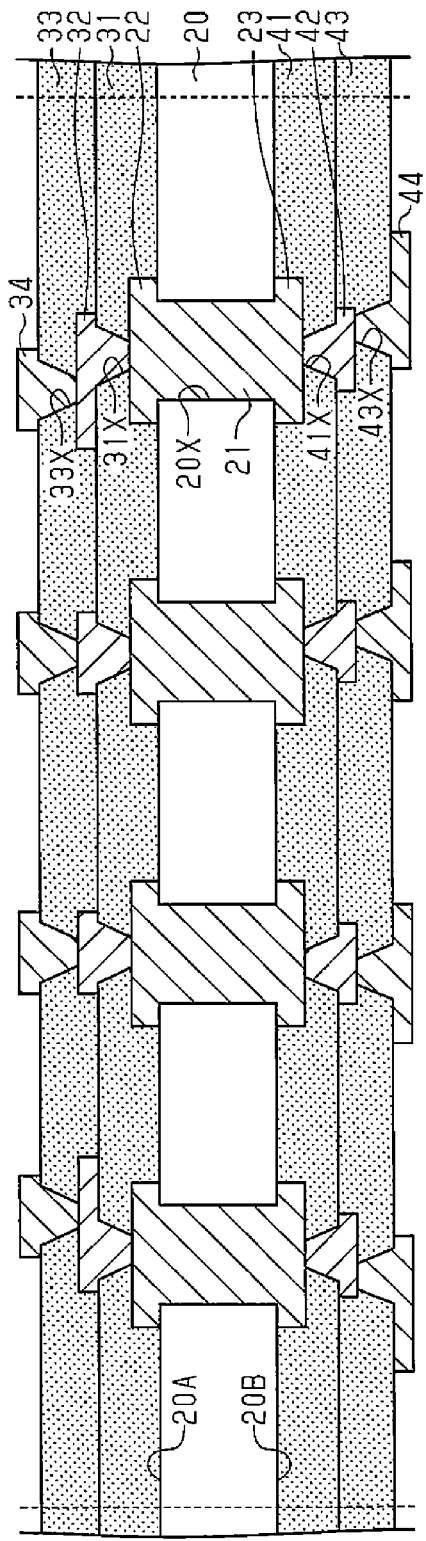

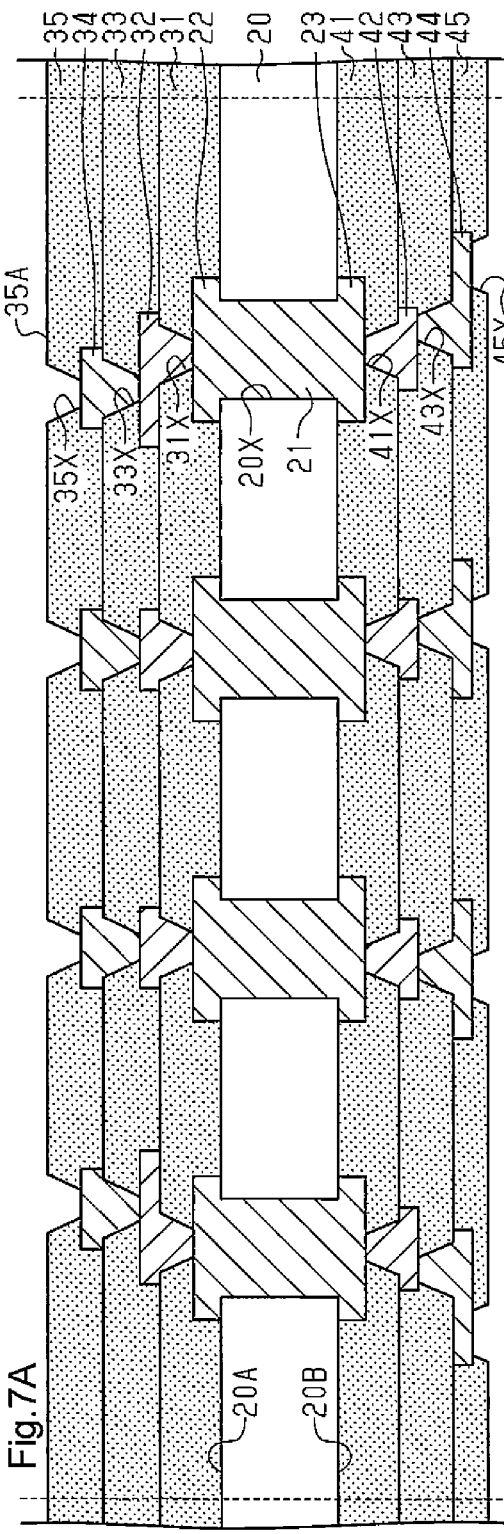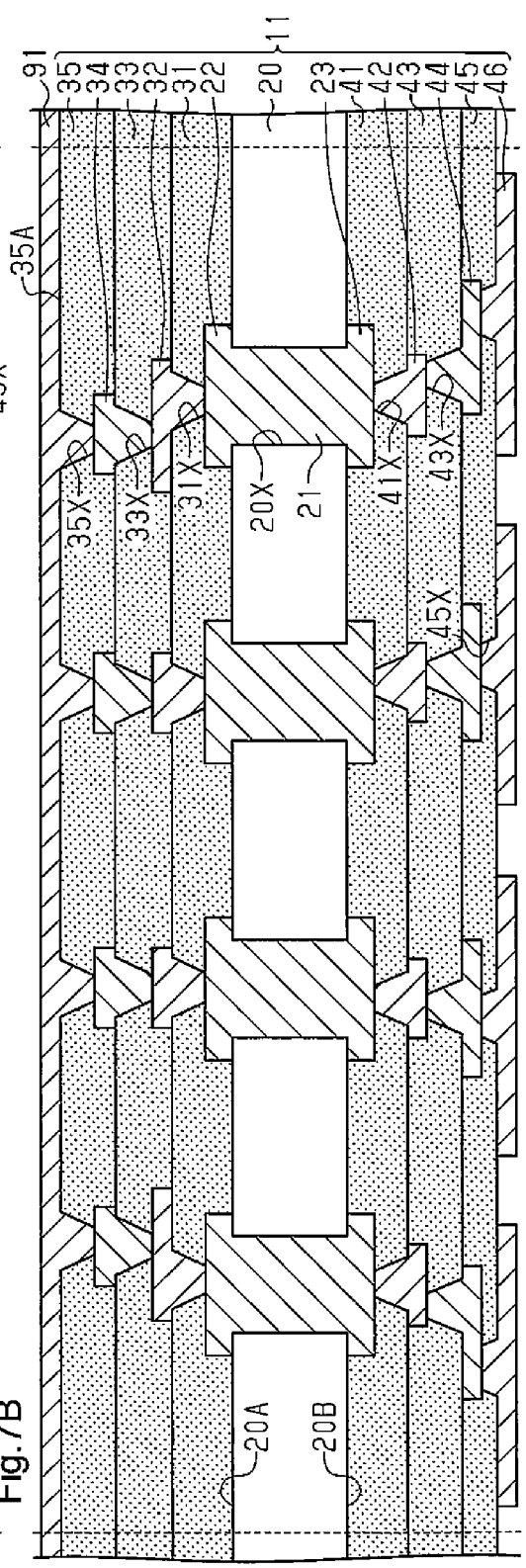

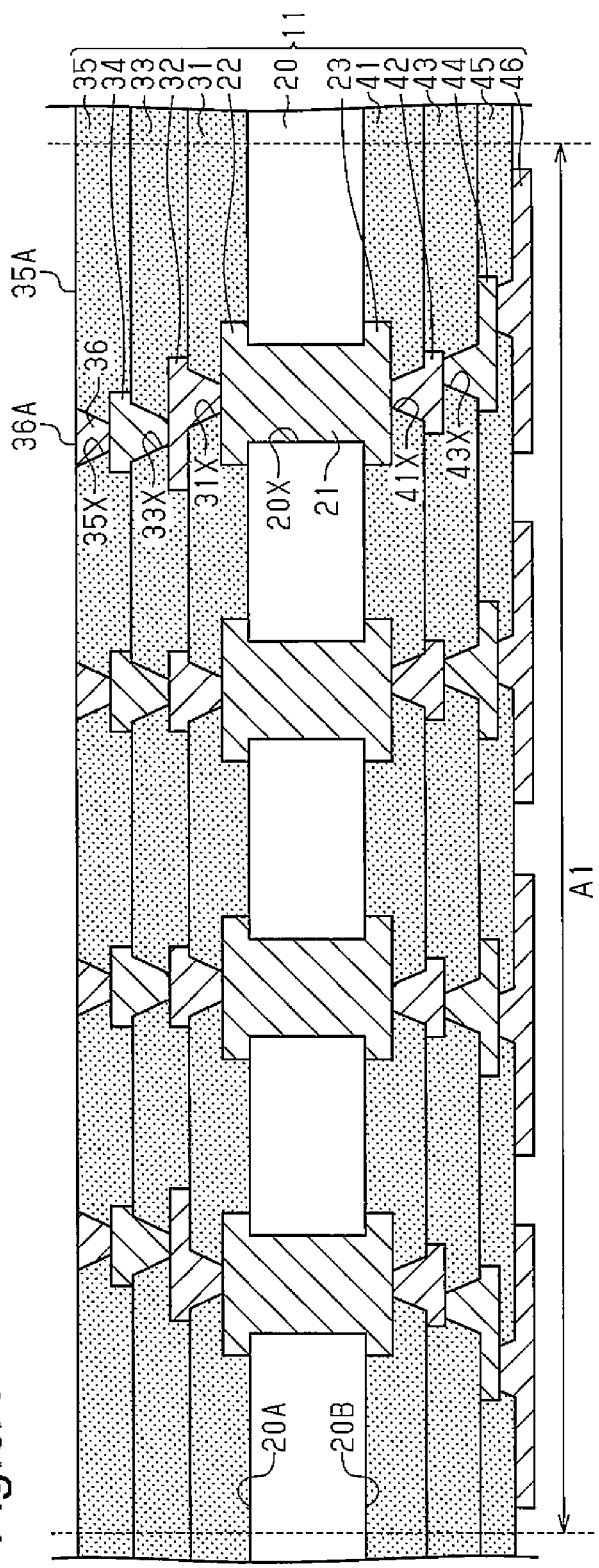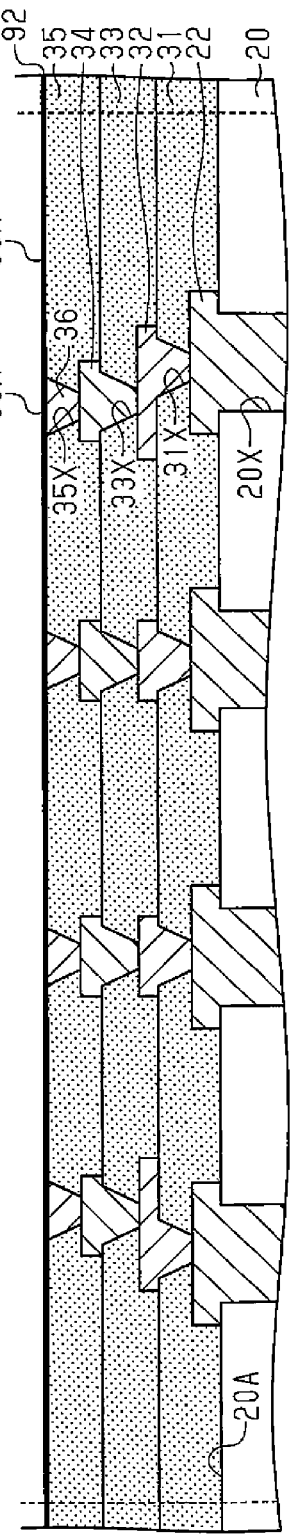

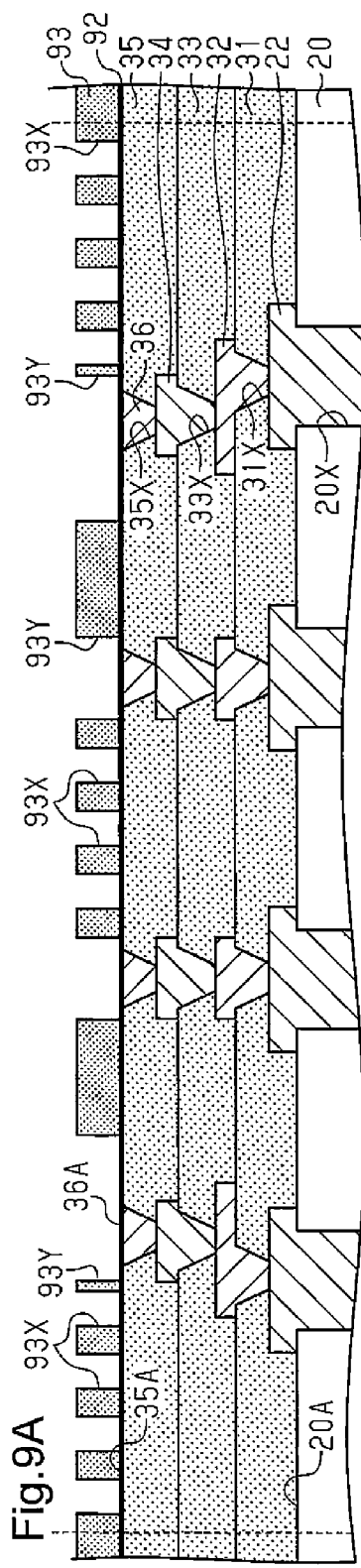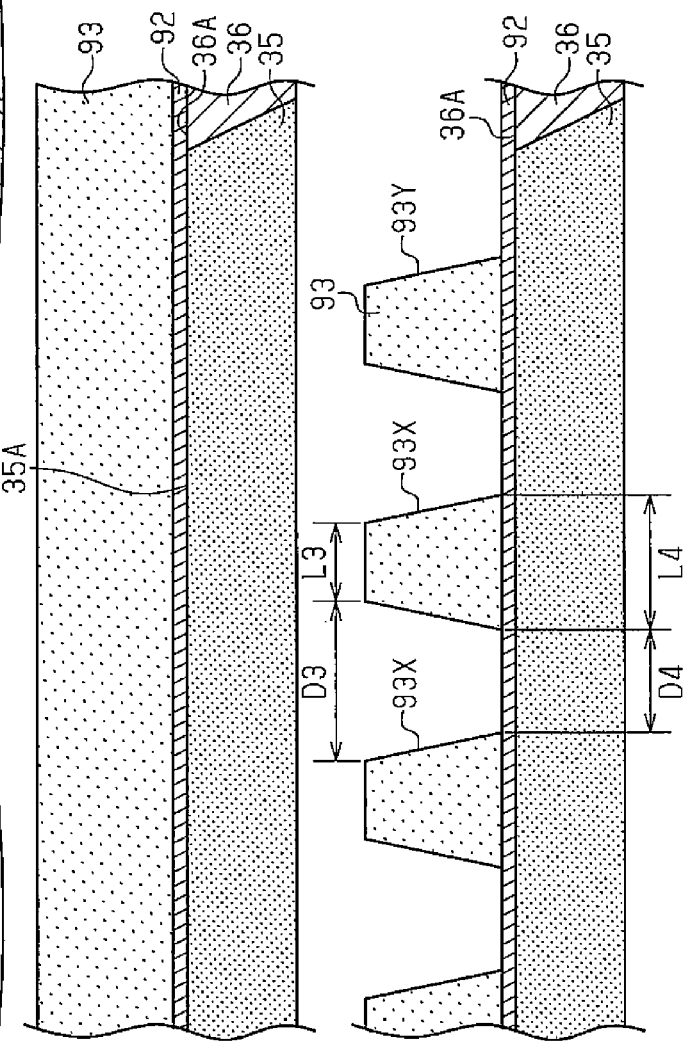

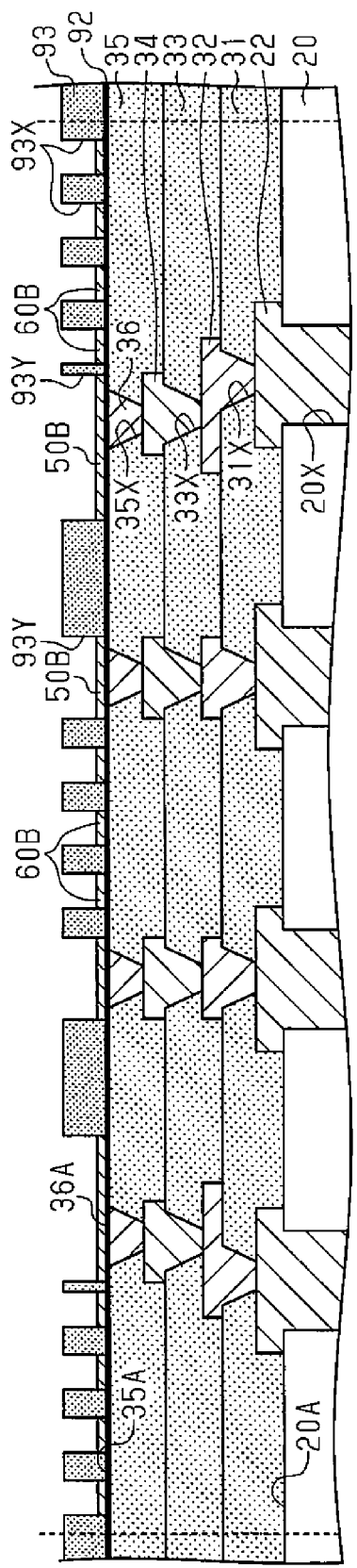
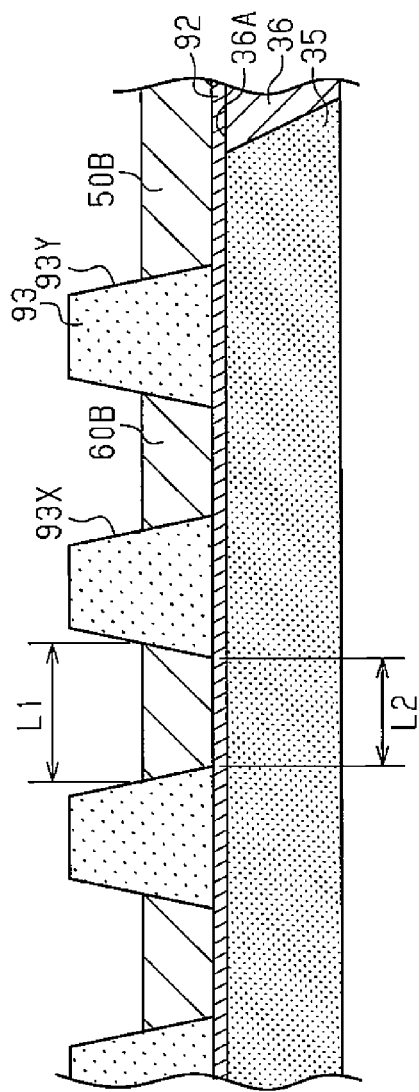
Fig.10A
Fig.10B

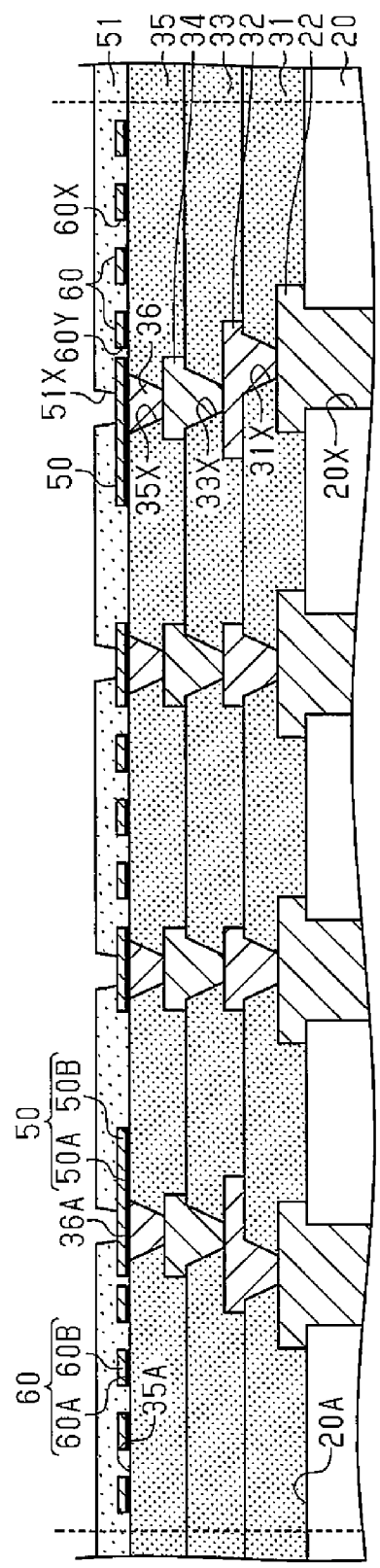
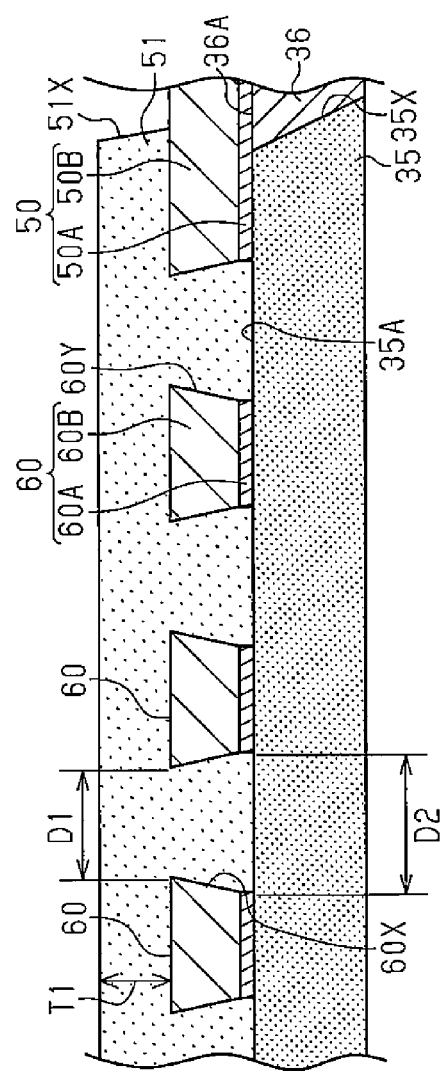
Fig. 12A
Fig. 12B

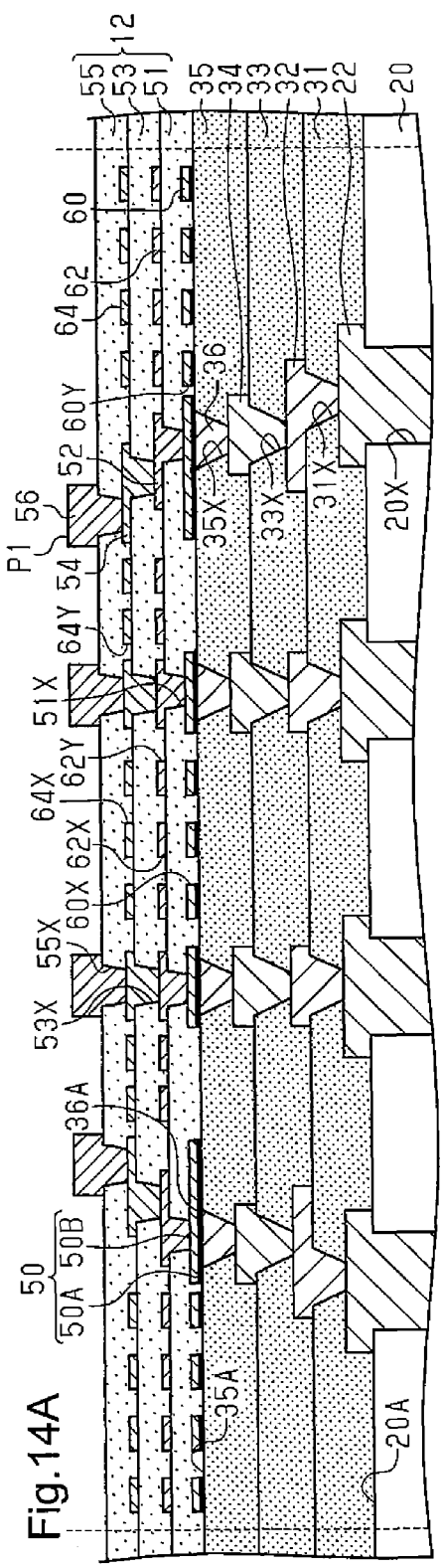
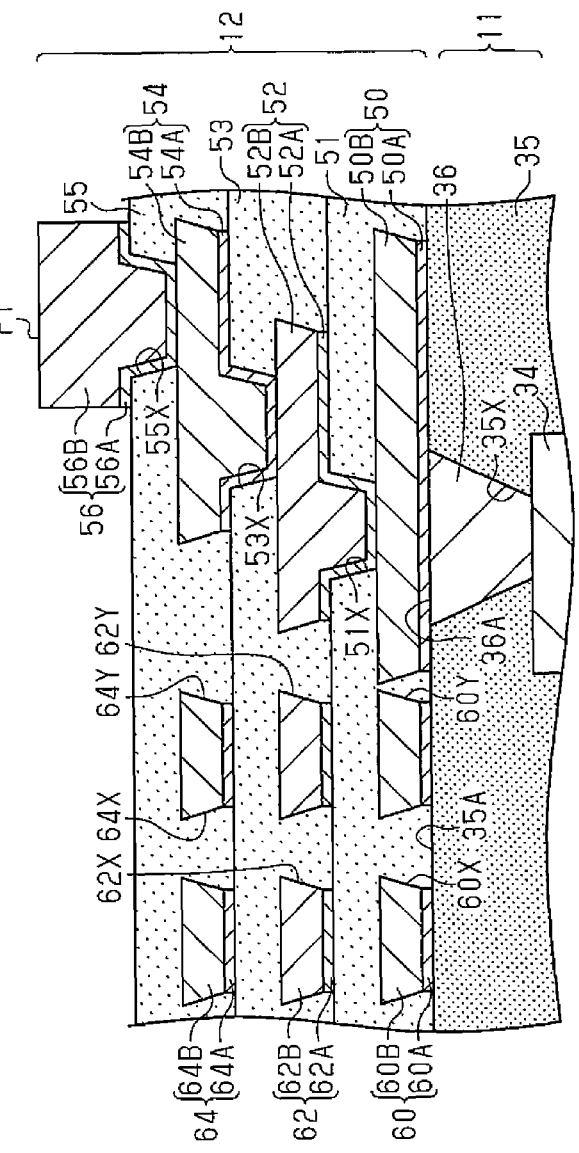
Fig.14A
Fig.14B

# WIRING SUBSTRATE, SEMICONDUCTOR DEVICE, AND METHOD FOR MANUFACTURING WIRING SUBSTRATE

CROSS-REFERENCE TO RELATED APPLICATIONS

This application is based upon and claims the benefit of priority from prior Japanese Patent Application No. 2014-119592, filed on Jun. 10, 2014, the entire contents of which are incorporated herein by reference.

FIELD

This disclosure relates to a wiring substrate, a semiconductor device, and a method for manufacturing the wiring substrate.

BACKGROUND

Electronic components, such as semiconductor elements, are mounted on wiring substrates. Such a wiring process undergoes a build-up process to increase the density of wiring patterns. Japanese Laid-Open Patent Publication Nos. 2003-023252 and 2003-023253 describe a wiring substrate including a core substrate. A build-up process is performed to stack wiring layers and insulation layers on the upper and lower surfaces of the core substrate.

In such type of a wiring substrate, a solid plane layer (e.g., power supply plane or ground (GND) plane) is formed immediately below an insulation layer to ensure flatness when forming wirings or to match the characteristic impedance. In a wiring substrate including the plane layer, a roughening process is performed on the plane layer to increase the adhesion of the plane layer and the insulation layer that covers the plane layer.

SUMMARY

A wiring layer is formed on the same plane as a plane layer. When the wiring layers are miniaturized, the roughening process greatly changes the shape of the wiring layer. Thus, the wiring layer would not be able to maintain the desired planar shape. If the roughening process is omitted, the adhesion of the plane layer and the insulation layer, which covers the plane layer, would become low. Thus, the insulation layer may easily defoliate from the plane layer.

One aspect of this disclosure is a wiring substrate including a first wiring structure and a second wiring structure stacked on an upper surface of the first wiring structure. The first wiring structure includes a first insulation layer and a via wiring that fills a first through hole extending through the first insulation layer in a thickness-wise direction. The via wiring includes an upper end face exposed from an upper surface of the first insulation layer. The second wiring structure includes a first wiring layer formed on the upper surface of the first insulation layer and the upper end face of the via wiring. The second wiring structure further includes a first plane layer stacked on the upper surface of the first insulation layer. The first plane layer is at least partially grid-shaped in a plan view to define second through holes extending through the first plane layer in the thickness-wise direction. The second wiring structure further includes a second insulation layer, stacked on the upper surface of the first insulation layer. The second insulation layer fills the second through holes and covers the first plane layer and the first wiring layer. The second wiring structure has a higher wiring density than the first wiring structure. The second through holes each include an upper open end and a lower open end, and the upper open end has a smaller open width than the lower open end.

BRIEF DESCRIPTION OF THE DRAWINGS

The invention, together with objects and advantages thereof, may best be understood by reference to the following description of the presently preferred embodiments together with the accompanying drawings in which:

FIGS. 5A to 5C, 6A, 6B, 7A, 7B, 8A, 8B, 9A to 9C, 10A, 10B, 11A, 11B, 12A, 12B, 13A, 13B, 14A, 14B, and 15 are schematic cross-sectional views illustrating a method for manufacturing the wiring substrate of FIG. 1, in which FIG. 10B is a partially enlarged cross-sectional view of FIG. 10A, FIG. 11B is a partially enlarged cross-sectional view of FIG. 11A, FIG. 12B is a partially enlarged cross-sectional view of FIG. 12A, FIG. 13B is a partially enlarged cross-sectional view of FIG. 13A, and FIG. 14B is a partially enlarged cross-sectional view of FIG. 14A;

DESCRIPTION OF THE EMBODIMENTS

Figure 1:
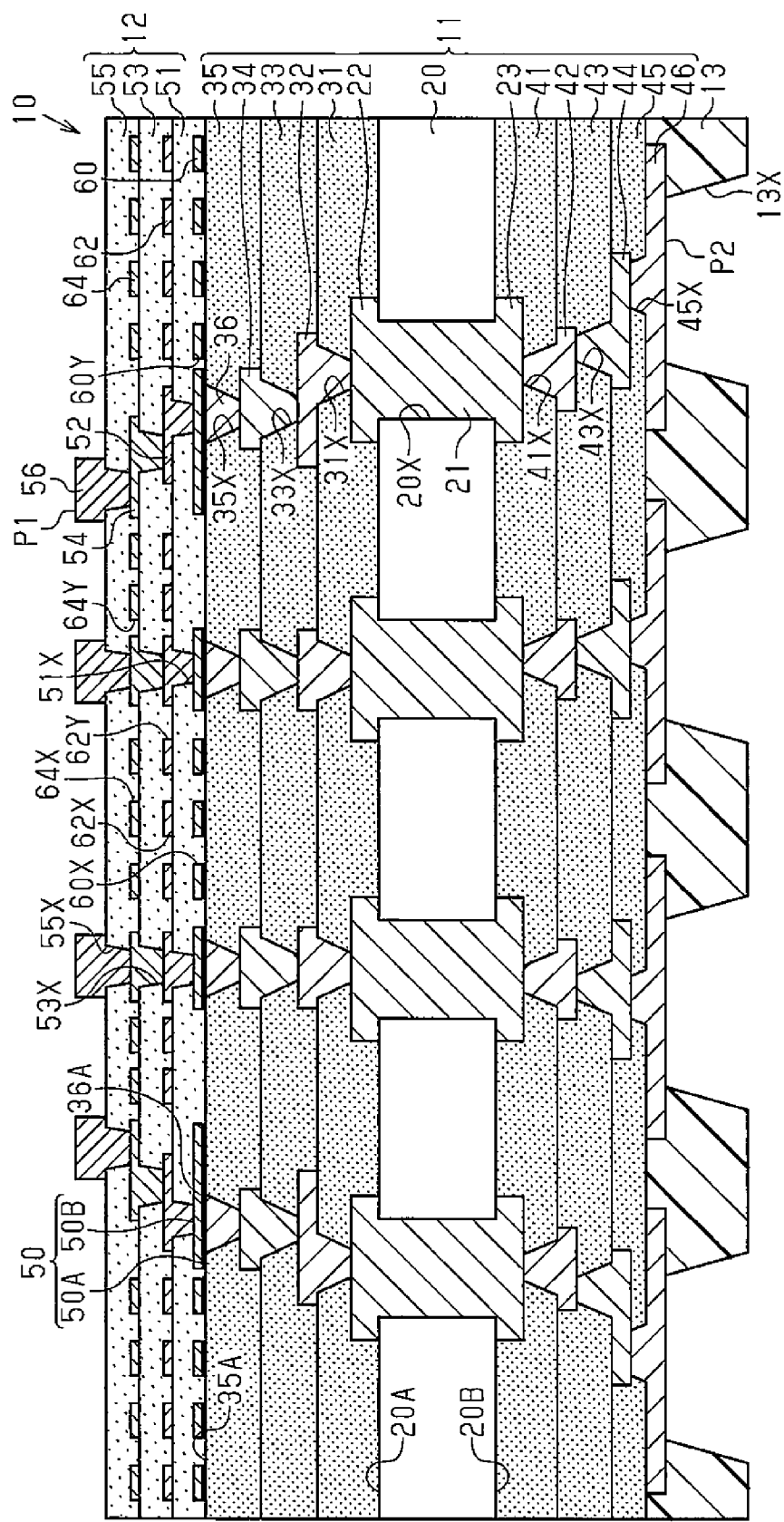
FIG. 1 is a schematic cross-sectional view illustrating a wiring substrate of a first embodiment.

Embodiments will now be described with reference to the drawings. In the drawings, elements are illustrated for simplicity and clarity and have not necessarily been drawn to scale. To facilitate understanding, instead of using hatching lines, components may be shaded.

First Embodiment

A first embodiment will now be described with reference to FIGS. 1 to 16. As illustrated in FIG. 1, a wiring substrate 10 includes a wiring structure 11, a wiring structure 12, and a solder resist layer 13. In the present example, the wiring structure 11 serves as a first wiring structure, and the wiring structure 12 serves as a second wiring structure. The wiring structure 12 is stacked on one of an upper surface and a lower surface of the wiring structure 11 (herein, upper surface of the wiring structure 11), and the solder resist layer 13 is stacked on the other surface of the wiring structure 11 (herein, lower surface of the wiring structure 11). The wiring substrate 10 may have any planar shape and any size. For example, the planar shape of the wiring substrate 10 has a square shape of about 20 mm×20 mm to 40 mm×40 mm.

First, the wiring structure 11 (first wiring structure) will now be described.

The wiring structure 11 includes a low density wiring layer having a lower wiring density than the wiring structure 12. A core substrate 20 is arranged at a central portion in a thickness-wise direction of the wiring structure 11. The core substrate 20 may be, for example, a glass epoxy substrate formed by impregnating a glass cloth (glass woven cloth), which is a reinforcement material, with a thermosetting insulative resin having a main component of epoxy-based resin and performing curing. The reinforcement material is not limited to the glass cloth, and for example, glass unwoven cloth, aramid woven cloth, aramid unwoven cloth, liquid crystal polymer (LCP) woven cloth, or LCP unwoven cloth may be used. The thermosetting insulative resin is not limited to the epoxy resin, and for example, polyimide resin, cyanate resin, and the like may be used. The core substrate 20 may contain, for example, a filler such as silica ($SiO_2$), alumina ($Al_2O_3$), and the like. The thickness of the core substrate 20 is, for example, about 80 to 800 μm.

A through hole 20X is formed at a certain location (four areas in FIG. 1) of the core substrate 20. The through hole 20X extends through the core substrate 20 from an upper surface 20A to a lower surface 20B of the core substrate 20. A through electrode 21 that extends through the core substrate 20 in the thickness-wise direction is formed in the through hole 20X. That is, the through hole 20X is filled with the through electrode 21. Although not illustrated, the through hole 20X and the through electrode 21 are substantially circular in a plan view, for example. The diameters of the through hole 20X and the through electrode 21 are, for example, about 50 to 100 μm. The pitch of the through holes 20X, that is, the pitch of the through electrodes 21 is, for example, about 100 to 200 μm. Copper (Cu) and copper alloy, for example, may be used as the material of the through electrode 21.

A wiring layer 22 is formed on the upper surface 20A of the core substrate 20, and a wiring layer 23 is formed on the lower surface 20B of the core substrate 20. The wiring layers 22, 23 are electrically connected to each other by the through electrode 21. Copper and copper alloy, for example, may be used as the material of the wiring layers 22, 23. The thickness of each wiring layer 22, 23 is, for example, about 15 to 35 μm. A line and space (L/S) of each wiring layer 22, 23 is, for example, about 20 μm/20 μm. The line and space is defined by wiring width (line L)/wiring spacing (space S).

An insulation layer 31, a wiring layer 32, an insulation layer 33, a wiring layer 34, an insulation layer 35, and a via wiring 36 are sequentially stacked on the upper surface 20A of the core substrate 20. A non-photosensitive and insulative resin having a thermosetting resin such as epoxy-based resin, polyimide-based resin, and the like as a main component may be used, for example, as the material of the insulation layers 31, 33, 35. The insulation layers 31, 33, 35 may contain, for example, a filler such as silica, alumina, and the like. Copper and copper alloy, for example, may be used as the material of the wiring layers 32, 34 and the via wiring 36. The thickness of each insulation layer 31, 33, 35 is, for example, about 20 to 45 μm. The thickness of each wiring layer 32, 34 is, for example, about 15 to 35 μm. The line and space (L/S) of each wiring layer 32, 34 is, for example, about 20 μm/20 μm.

The insulation layer 31 is formed on the upper surface 20A of the core substrate 20 so as to cover the wiring layer 22. The insulation layer 31 includes a through hole 31X that extends through a certain location of the insulation layer 31 in the thickness-wise direction and partially exposes the upper surface of the wiring layer 22.

The wiring layer 32 is stacked on the upper surface of the insulation layer 31. The wiring layer 32 is electrically connected to the wiring layer 22 by a via wiring filling the through hole 31X. For example, the wiring layer 32 is integrally formed with the via wiring filling the through hole 31X.

The insulation layer 33 is formed on the upper surface of the insulation layer 31 so as to cover the wiring layer 32. The insulation layer 33 includes a through hole 33X that extends through a certain location of the insulation layer 33 and partially exposes the upper surface of the wiring layer 32.

The wiring layer 34 is stacked on the upper surface of the insulation layer 33. The wiring layer 34 is electrically connected to the wiring layer 32 by a via wiring filling the through hole 33X. For example, the wiring layer 34 is integrally formed with the via wiring filling the through hole 33X.

The insulation layer 35 is the outermost insulation layer (uppermost insulation layer herein) in the wiring structure 11. The insulation layer 35 is formed on the upper surface of the insulation layer 33 so as to cover the wiring layer 34. The insulation layer 35 includes a through hole 35X that opens at a certain location in the upper surface 35A of the insulation layer 35, extends through the insulation layer 35 in the thickness-wise direction, and partially exposes the upper surface of the wiring layer 34.

The upper surface 35A of the insulation layer 35 is a smooth surface with few pits and valleys. That is, the upper surface 35a has a low surface roughness. For example, the upper surface 35A of the insulation layer 35 has a lower surface roughness than the wall surface of the through hole 35X. The roughness of the upper surface 35A of the insulation layer 35 is set to a surface roughness value Ra of about 15 to 40 nm, for example. The roughness of the wall surface of the through hole 35X is set to a surface roughness value Ra of about 300 to 400 nm, for example. The surface roughness value Ra is also referred to as an arithmetic average roughness, and is obtained by calculating the arithmetic average of the absolute values of the height that changes within a measurement region from a surface, which is an average line.

Each through hole 31X, 33X, 35X is tapered so that the diameter decreases from the upper side (side closer to the wiring structure 12) toward the lower side (side closer to the core substrate 20) in FIG. 1. For example, each through hole 31X, 33X, 35X has an inverted truncated conical shape in which an upper open end has a larger open diameter than a lower open end. The open diameter of the upper open end of each through hole 31X, 33X, 35X is, for example, about 60 to 70 μm.

A via wiring 36 that electrically connects the wiring layer 34 and the wiring layer 50 formed on the upper surface 35A of the insulation layer 35 is formed in the through hole 35X. The via wiring 36 is the outermost wiring layer (uppermost wiring layer herein) in the wiring structure 11. The via wiring 36 extends through the insulation layer 35 in the thickness-wise direction. Like the through hole 35X, the via wiring 36 is tapered so that the diameter decreases from the upper side (side closer to the wiring layer 50) toward the lower side (side closer to the wiring layer 34) in FIG. 1. For example, the via wiring 36 has a substantially inverted truncated conical shape in which an upper end face 36A has a larger diameter than a lower end face. The upper end face 36A of the via wiring 36 is exposed from the insulation layer 35. For example, the upper end face 36A of the via wiring 36 is substantially flush with the upper surface 35A of the insulation layer 35. The upper end face 36A of the via wiring 36 is directly joined with the wiring layer 50. The diameter of the upper end face 36A of the via wiring 36 is, for example, about 60 to 70 µm.

An insulation layer 41, a wiring layer 42, an insulation layer 43, a wiring layer 44, an insulation layer 45, and a wiring layer 46 are sequentially stacked on the lower surface 20B of the core substrate 20. A non-photosensitive and insulative resin having a thermosetting resin such as epoxy-based resin, polyimide-based resin, and the like as a main component may be used, for example, as the material of the insulation layers 41, 43, 45. The insulation layers 41, 43, 45 may contain, for example, a filler such as silica, alumina, and the like. Copper and copper alloy, for example, may be used as the material of the wiring layers 42, 44 and 46. The thickness of each insulation layer 41, 43, 45 is, for example, about 20 to 45 µm. The thickness of each wiring layer 42, 44, 46 is, for example, about 15 to 35 µm. The line and space (L/S) of each wiring layer 42, 44, 46 is, for example, about 20 µm/20 µm.

The insulation layer 41 is formed on the lower surface 20B of the core substrate 20 so as to cover the wiring layer 23. The insulation layer 41 includes a through hole 41X that extends through a certain location of the insulation layer 41 in the thickness-wise direction and partially exposes the lower surface of the wiring layer 23.

The wiring layer 42 is stacked on the lower surface of the insulation layer 41. The wiring layer 42 is electrically connected to the wiring layer 23 by a via wiring filling the through hole 41X. For example, the wiring layer 42 is integrally formed with the via wiring filling the through hole 41X.

The insulation layer 43 is formed on the lower surface of the insulation layer 41 so as to cover the wiring layer 42. The insulation layer 43 includes a through hole 43X that extends through a certain location of the insulation layer 43 and partially exposes the lower surface of the wiring layer 42.

The wiring layer 44 is stacked on the lower surface of the insulation layer 43. The wiring layer 44 is electrically connected to the wiring layer 42 by a via wiring filling the through hole 43X. For example, the wiring layer 44 is integrally formed with the via wiring filling the through hole 43X.

The insulation layer 45 is formed on the lower surface of the insulation layer 43 so as to cover the wiring layer 44. The insulation layer 45 is the outermost insulation layer (lowermost insulation layer herein) in the wiring structure 11. The insulation layer 45 includes a through hole 45X that extends through a certain location of the insulation layer 45 in the thickness-wise direction and exposes the lower surface of the wiring layer 44.

Each through hole 41X, 43X, 45X is tapered shape so that the diameter decreases from the lower side (side closer to the solder resist layer 13) toward the upper side (side closer to the core substrate 20) in FIG. 1. For example, each through hole 41X, 43X, 45X has a truncated conical shape in which the lower open end has an open diameter that is larger than that of the upper open end. The open diameter of the lower open end of each through hole 41X, 43X, 45X is, for example, about 60 to 70 µm.

The wiring layer 46 is formed on the lower surface of the insulation layer 45. The wiring layer 46 is the outermost insulation layer (lowermost insulation layer herein) in the wiring structure 11. The wiring layer 46 is electrically connected to the wiring layer 44 by a via wiring filling the through hole 45X. For example, the wiring layer 46 is integrally formed with the via wiring filling the through hole 45X.

The wiring structure 12 (second wiring structure) will now be described.

The wiring structure 12 includes a high density wiring layer having a higher wiring density than the wiring structure 11. The wiring structure 12 has a stacked wiring structure in which the wiring layer 50 and the plane layer 60 stacked on the insulation layer 35, an insulation layer 51, a wiring layer 52, a plane layer 62, an insulation layer 53, a wiring layer 54, a plane layer 64, an insulation layer 55, and a wiring layer 56 are sequentially stacked. The wiring structure 12 is substantially equal to the total thickness of each insulation layer in the wiring structure 12 (i.e., thickness from upper surface 35A of insulation layer 35 to upper surface of insulation layer 55). The thickness of the wiring structure 12 is, for example, about 20 to 40 µm.

Copper and copper alloy, for example, may be used as the material of the wiring layers 50, 52, 54, 56 and the plane layers 60, 62, 64. A photosensitive and insulative resin having a main component of phenol-based resin, polyimide-based resin, or the like, for example, may be used as the material of the insulation layers 51, 53, 55. The insulation layers 51, 53, 55 may contain a filler such as silica, alumina, and the like.

The wiring layers 50, 52, 54, 56 are finer than each wiring layer of the wiring structure 11. For example, the line and space (L/S) of each wiring layer 50, 52, 54, 56 is, for example, smaller than 10 µm/10 µm. Each wiring layer 50, 52, 54, 56 is thinner than each wiring layer of the wiring structure 11. In the same manner, each of the plane layers 60, 62, 64 is thinner than each wiring layer of the wiring structure 11. The thickness of each wiring layer 50, 52, 54 and each plane layer 60, 62, 64 is, for example, about 1 to 3 µm. The thickness of the wiring layer 56 is, for example, about 10 to 15 µm. Each insulation layer 51, 53, 55 is thinner than each insulation layer of the wiring structure 11. The thickness of each insulation layer 51, 53, 55 is, for example, about 5 to 10 µm.

Each wiring layer 50, 52, 54, 56 has a lower surface roughness than each wiring layer of the wiring structure 11. The surface roughness of each wiring layer 50, 52, 54, 56 is, for example, set to the surface roughness value Ra of about 1 to 10 nm. The surface roughness of each wiring layer 22, 23, 32, 34, 42, 44, 46 of the wiring structure 11 is, for example, set to the surface roughness value Ra of about 100 to 300 nm.

The wiring layer 50 is stacked on the upper surface 35A of the insulation layer 35 so as to be connected to the upper end face 36A of the via wiring 36. The lower surface of the wiring layer 50 partially contacts the upper end face 36A of the via wiring 36 to electrically connect the wiring layer 50 and the via wiring 36. The wiring layer 50 and the via wiring 36 are electrically connected but are not integrally formed. For example, the wiring layer 50 includes a seed layer 50A formed on the upper end face 36A of the via wiring 36 and a metal layer 50B formed on the seed layer 50A. Therefore, the metal layer 50B is electrically connected to the via wiring 36 by the seed layer 50A.

Figure 2:
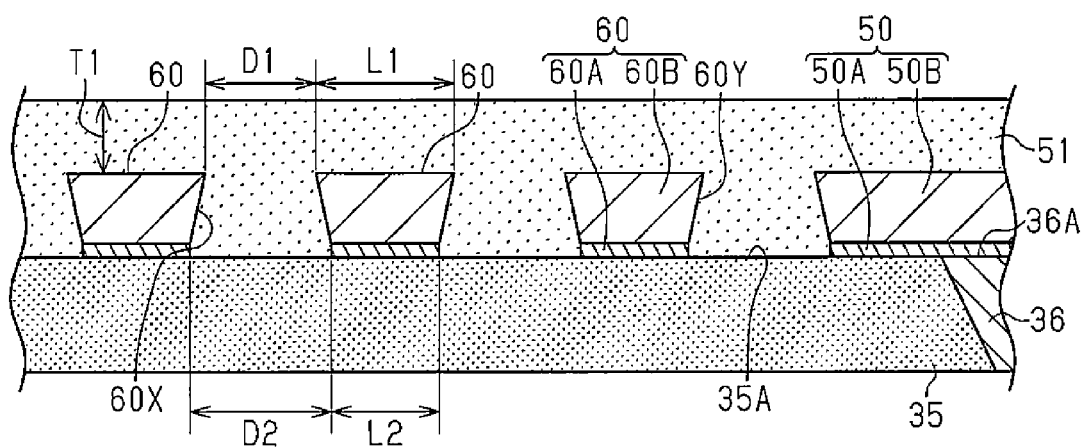
FIG. 2 is a partially enlarged cross-sectional view illustrating of a plane layer in the wiring substrate of FIG. 1.

As illustrated in FIG. 2, the seed layer 50A covers the upper end face 36A of the via wiring 36 and covers the upper surface 35A of the insulation layer 35 around the upper end face 36A. A metal film (sputter film) formed by the sputtering, for example, may be used for the seed layer 50A. A metal film having a dual-layer structure, for example, may be used as the seed layer 50A formed through sputtering. Such a metal film (seed layer 50A) having a dual-layer structure may be formed, for example, from a titanium (Ti) layer, which is stacked on the upper end face 36A of the via wiring 36 and the upper surface 35A of the insulation layer 35, and a copper (Cu) layer, which is stacked on the Ti layer. In this case, the thickness of the Ti layer is, for example, about 20 to 50 nm, and the thickness of the Cu layer is, for example, about 100 to 300 nm. The Ti layer functions as a metal barrier film that suppresses the copper from diffusing from the Cu layer and the metal layer 50B (e.g., Cu layer) to the insulation layer 35. Titanium nitride (TiN), tantalum nitride (TaN), tantalum (Ta), chromium (Cr), or the like may be used in lieu of Ti as the material of the metal film that functions as the metal barrier film.

The metal layer 50B covers the entire upper surface of the seed layer 50A. An electrolytic plated metal layer formed through electrolytic plating, for example, may be used as the metal layer 50B. Copper and copper alloy, for example, may be used as the material of the metal layer 50B.

The plane layer 60 is stacked on the upper surface 35A of the insulation layer 35. The plane layer 60 partially covers the upper surface 35A of the insulation layer 35 that is not covered by the wiring layer 50. The plane layer 60 is formed to be planar and, for example, functions as the power supply plane and the ground plane.

Figure 3:
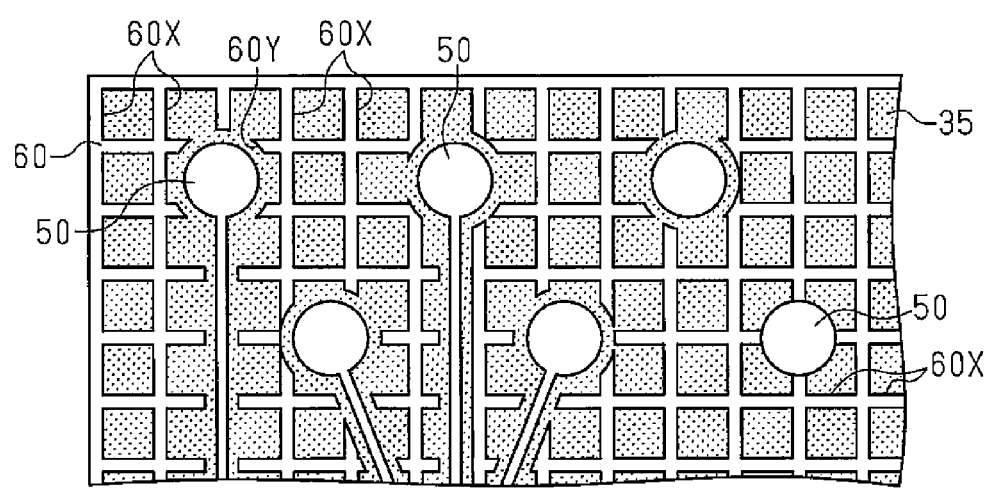
FIG. 3 is a schematic plan view illustrating the plane layer of FIG. 2.

For example, as illustrated in FIG. 3, the plane layer 60 is substantially grid-shaped (meshed, or netted) in a plan view. In other words, the plane layer 60 includes through holes 60X formed in a matrix form, for example, in a plan view. The through holes 60X extend through certain locations of the plane layer 60 in the thickness-wise direction. The planar arrangement of the through holes 60X is not limited to the matrix form, and may be a staggered form, for example. Each through hole 60X has a certain planar shape (e.g., tetragonal shape). The through hole 60X may be arranged over the entire upper surface 35A of the insulation layer 35 or may be partially arranged only at the outer circumference, and the like of the upper surface 35A.

The plane layer 60 includes a through hole 60Y that extends through a certain location of the plane layer 60 in the thickness-wise direction. The plane layer 60 is electrically insulated from portions of the wiring layer 50 where the through holes 60Y are located. In other words, a portion of the wiring layer 50 is arranged in each through hole 60Y spaced apart by a predetermined distance from the plane layer 60. Thus, the plane layer 60 is grid-shaped in a plan view so as to surround the portions of the wiring layer 50 where the through holes 60Y are located. Each through hole 60Y may have any planar shape (e.g., substantially circular shape). The plane layer 60 is electrically connected to another part (e.g., portion of the wiring layer 50 illustrated at the lower right in FIG. 3) of the wiring layer 50. Therefore, the plane layer 60 does not include the through hole 60Y at the position electrically connected to the wiring layer 50.

As illustrated in FIG. 2, like the wiring layer 50, the plane layer 60 includes a seed layer 60A, which is formed on the upper surface 35A of the insulation layer 35, and a metal layer 60B, which is formed on the seed layer 60A. For example, a metal film having a structure and material similar to the seed layer 50A may be used as the seed layer 60A. Furthermore, for example, a metal layer having a structure and a material similar to the metal layer 50B may be used as the metal layer 60B.

The plane layer 60 (in particular, metal layer 60B) is tapered so that the width (dimension in a plan view) decreases from the upper side (side closer to the upper surface of the insulation layer 51) to the lower side (side closer to the insulation layer 35) in FIG. 2. For example, the plane layer 60 has a substantially inverted trapezoidal cross-section in which a width L1 of the upper surface is larger than a width L2 of the lower surface. Therefore, the through hole 60X is tapered so that the open width decreases from the lower side (side closer to the insulation layer 35) toward the upper side (side closer to the upper surface of the insulation layer 51) in FIG. 2. For example, the through hole 60X has a substantially trapezoidal cross-section in which an open width D1 of the upper open end is smaller than an open width D2 of the lower open end. Therefore, an upper opening of the through hole 60X is smaller than a lower opening of the through hole 60X.

In other words, a portion of the side surface of the plane layer 60 (upper side surface of the metal layer 60B in the present example) projects toward the center of the through hole 60X in a plan view and overlaps a portion of the upper surface 35A of the insulation layer 35 that is not covered by the seed layer 60A in a plan view.

The open width D1 of each through hole 60X is, for example, preferably greater than the thickness T1 of the insulation layer 51 formed on the plane layer 60. For example, the open width D1 is about 2 to 5 µm, and the thickness T1 is about 1 to 2 µm.

The insulation layer 51 is formed on the upper surface 35A of the insulation layer 35 so as to cover the wiring layer 50 and the plane layer 60. That is, the through holes 60X, 60Y of the plane layer 60 are filled with the insulation layer 51. Therefore, the insulation layer 51 covers the side surface of the plane layer 60 (seed layer 60A and the metal layer 60B) and the side surface of the wiring layer 50 (seed layer 50A and metal layer 50B). The upper side surface of the plane layer 60 (upper side surface of metal layer 60B) projects toward the center of the through hole 60X as compared to a lower part side surface of the plane layer 60 (lower part side surface of the seed layer 60A). The through hole 60X has a substantially trapezoidal cross-section. Therefore, the insulation layer 51 in the through hole 60X has a substantially inverted trapezoidal cross-section. That is, the through hole 60X is filled with the insulation layer 51 so that the insulation layer 51 is partially located under the side surface of the plane layer 60.

As illustrated in FIG. 1, the insulation layer 51 includes a through hole 51X that extends through a certain location of the insulation layer 51 in the thickness-wise direction and partially exposes the upper surface of the wiring layer 50.

The wiring layer 52 is stacked on the upper surface of the insulation layer 51. The wiring layer 52 is electrically connected to the wiring layer 50 by a via wiring filling the through hole 51X. For example, the wiring layer 52 is integrally formed with the via wiring filling the through hole 51X.

The plane layer 62 is stacked on the upper surface of the insulation layer 51. The plane layer 62 partially covers the upper surface of the insulation layer 51 that is not covered by the wiring layer 52. The plane layer 62 is formed to be planar and, for example, functions as the power supply plane and the GND plane. The plane layer 62 is substantially grid-shaped in a plan view, like the plane layer 60. In other words, the plane layer 62 includes through holes 62X in a matrix form, for example, in a plan view. The through holes 62X extend through certain locations of the plane layer 62 in the thickness-wise direction. The cross-sectional shape of the plane layer 62 is similar to the cross-sectional shape of the plane layer 60, and the cross-sectional shape of the through hole 62X is similar to the cross-sectional shape of the through hole 60X (see FIG. 3).

The plane layer 62 includes a through hole 62Y that extends through a certain location of the plane layer 62 in the thickness-wise direction. The through hole 62Y is formed in the same manner as the through hole 60Y (see FIG. 3). A portion of the wiring layer 52 is arranged in each through hole 62Y so that the plane layer 62 is electrically insulated from the portion of the wiring layer 52 in each through hole 62Y. Although not illustrated in the drawings, the plane layer 62 is also electrically connected to another portion of the wiring layer 52 like the plane layer 60.

The insulation layer 53 is formed on the upper surface of the insulation layer 51 so as to cover the wiring layer 52 and the plane layer 62. That is, the through holes 62X, 62Y of the plane layer 62 are filled with the insulation layer 53. Therefore, the insulation layer 53 covers the side surface of the plane layer 62 and the side surface of the wiring layer 52. The insulation layer 53 includes a through hole 53X that extends through a certain location of the insulation layer 53 in the thickness-wise direction and partially exposes the upper surface of the wiring layer 52.

The wiring layer 54 is stacked on the upper surface of the insulation layer 53. The wiring layer 54 is electrically connected to the wiring layer 52 through a via wiring filling the through hole 53X. For example, the wiring layer 54 is integrally formed with the via wiring filling the through hole 53X.

The plane layer 64 is stacked on the upper surface of the insulation layer 53. The plane layer 64 partially covers the upper surface of the insulation layer 53 that is not covered by the wiring layer 54. The plane layer 64 is formed to be planar and, for example, functions as the power supply plane and the GND plane. The plane layer 64 is substantially grid-shaped in a plan view like the plane layer 60. In other words, the plane layer 64 includes through holes 64X in a matrix form, for example, in a plan view. The through holes 64X extend through certain locations of the plane layer 64 in the thickness-wise direction. The cross-sectional shape of the plane layer 64 is similar to the cross-sectional shape of the plane layer 60, and the cross-sectional shape of the through hole 64X is similar to the cross-sectional shape of the through hole 60X (see FIG. 3).

The plane layer 64 includes a through hole 64Y that extends through a certain location of the plane layer 64 in the thickness-wise direction. The through hole 64Y is formed in the same manner as the through hole 60Y (see FIG. 3). A portion of the wiring layer 54 is arranged in each through hole 64Y so that the plane layer 64 is electrically insulated from the portion of the wiring layer 54 in each through hole 64Y. Although not illustrated, the plane layer 64 is also electrically connected to another part of the wiring layer 54 like the plane layer 60.

The insulation layer 55 is formed on the upper surface of the insulation layer 53 so as to cover the wiring layer 54 and the plane layer 64. That is, the through holes 64X, 64H of the plane layer 64 are filled with the insulation layer 55. Therefore, the insulation layer 55 covers the side surface of the plane layer 64 and the side surface of the wiring layer 54. The insulation layer 55 includes a through hole 55X that extends through a certain location of the insulation layer 55 in the thickness-wise direction and partially exposes the upper surface of the wiring layer 54.

Each through hole 51X, 53X, 55X is tapered so that the diameter decreases from the upper side (side closer to the wiring layer 56) toward the lower side (side closer to the wiring structure 11) in FIG. 1. For example, each through hole 51X, 53X, 55X has an inverted truncated conical shape in which the upper open end has a larger open diameter than the lower open end. The open diameter of the upper open end of each through hole 51X, 53X, 55X is, for example, about 10 to 20 μm.

The wiring layer 56 is stacked on the upper surface of the insulation layer 55. The wiring layer 56 is electrically connected to the wiring layer 54 through the via wiring filling the through hole 55X. For example, the wiring layer 56 is integrally formed with the via wiring filling the through hole 55X. The wiring layer 56 includes pads P1 that project from the upper surface of the insulation layer 55. Each pad P1 may have any planar shape and any size. For example, the planar shape of the pad P1 is circular and has a diameter of about 20 to 30 μm. The pitch of the pads P1 is, for example, about 40 to 60 μm. The pad P1 functions as an electronic component mounting pad used to electrically connect to the electronic component such as the semiconductor chip and the like.

A surface processed layer may be formed on the surface (both upper surface and side surface or only upper surface) of each pad P1 when necessary. An example of the surface processed layer includes a gold (Au) layer, a nickel (Ni) layer/Au layer (metal layer in which Ni layer and Au layer are stacked in this order), an Ni layer/palladium (Pd) layer/Au layer (metal layer in which Ni layer, Pd layer, and Au layer are stacked in this order), and the like. A non-electrolytic plated metal layer formed by a non-electrolytic plating, for example, may be used for the Ni layer, the Au layer, and the Pd layer. The Ni layer is the metal layer formed from Ni or Ni alloy, the Au layer is the metal layer formed from Au or Au alloy, and the Pd layer is the metal layer formed from Pd or Pd alloy. An oxidation resistant processing such as Organic Solderability Preservative (OSP) process, and the like may be performed on the surface (both upper surface and side surface or only upper surface) of the pad P1 to form an OSP film that functions as the surface processed layer.

The solder resist layer 13 is the outermost insulation layer (lowermost insulation layer herein) in the wiring substrate 10. The solder resist layer 13 covers the lowermost wiring layer 46 on the lower surface of the wiring structure 11 (lower surface of the lowermost insulation layer 45 of the wiring structure 11).

The solder resist layer 13 includes an opening 13X exposing portions of the lowermost wiring layer 46 as external connection pads P2. An external connection terminal such as a solder ball, a lead pin, and the like used when mounting the wiring substrate 10 on a mounting substrate such as a motherboard or the like is connected to each external connection pad P2. The surface processed layer may be formed on the wiring layer 46 exposed from the opening 13X when necessary. An example of the surface processed layer includes an Au layer, an Ni/Au layer (metal layer in which Ni layer and Au layer are stacked in this order), an Ni layer/Pd layer/Au layer (metal layer in which Ni layer, Pd layer, and Au layer are stacked in this order), and the like. The non-electrolytic plated metal layer, for example, may be used for the Ni layer, the Au layer, and the Pd layer. The oxidation resistant process such as the OSP process is performed on the lower surface of the external connection pad P2 to form the OSP film that functions as the surface processed layer. The wiring layer 46 exposed from the opening 13X may be used as the external connection terminal. Alternatively, if the surface processed layer is formed on the wiring layer 46, the surface processed layer may be used as the external connection terminal.

The external connection pad P2 and the opening 13X may have any planar shape and any size. For example, the planar shapes of the external connection pad P2 and the opening 13X may be circular and have a diameter of about 200 to 300 µm. The material of the solder resist layer 13 may be, for example, a photosensitive and insulative resin having a main component of a phenol-based resin, a polyimide-based resin, or the like. The solder resist layer 13 may, for example, contain a filler such as silica, alumina, or the like.

The thickness of the solder resist layer 13, that is, the thickness from the lower surface of the insulation layer 45 to the lower surface of the solder resist layer 13 is set to be greater than or equal to the thickness of the wiring structure 12. The warping amount of the wiring substrate 10 may be reduced by setting the thickness of the solder resist layer 13 in such a manner.

Figure 4:
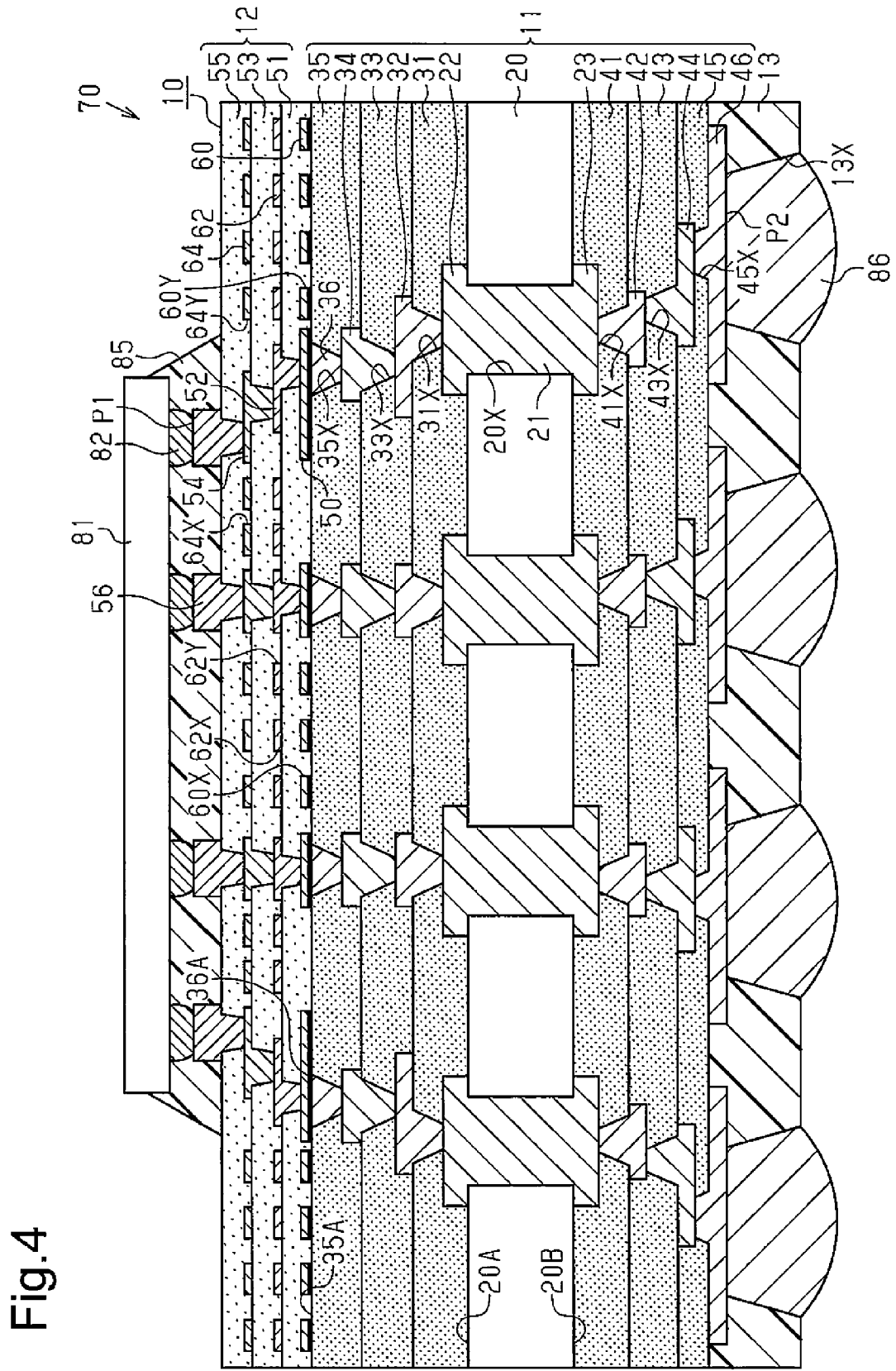
FIG. 4 is a schematic cross-sectional view illustrating a semiconductor device including the wiring substrate of FIG. 1.

The structure of a semiconductor device 70 will now be described with reference to FIG. 4.

The semiconductor device 70 includes the wiring substrate 10, one or more semiconductor chips 81, an underfill resin 85, and an external connection terminal 86.

The semiconductor chip 81 is flip-chip-mounted on the wiring substrate 10. Bumps 82 on a circuit formation surface (lower surface herein) of the semiconductor chip 81 are joined with the pads P1 of the wiring substrate 10 so that the semiconductor chip 81 is electrically connected to the wiring layer 56 by the bumps 82.

The semiconductor chip 81 may be, for example, a logic chip such as a Central Processing Unit (CPU) chip, a Graphics Processing Unit (GPU) chip, and the like. The semiconductor chip 81 may also be a memory chip such as a DRAM (Dynamic Random Access Memory) chip, a SRAM (Static Random Access Memory) chip, a flash memory chip, or the like. A plurality of semiconductor chips 81 such as the logic chip and the memory chip may be mounted on the wiring substrate 10.

The semiconductor chip 81, for example, has a size of about 3 mm×3 mm to 12 mm×12 mm in a plan view. The thickness of the semiconductor chip 81 is, for example, about 50 to 100 µm.

The bump 82 may be, for example, a gold bump or a solder bump. The material of the solder bump may be, for example, alloy containing lead (Pb), alloy of tin (Sn) and Au, alloy of Sn and Cu, alloy of Sn and silver (Ag), alloy of Sn, Ag, Cu, and the like.

The underfill resin 85 fills a gap between the wiring substrate 10 and the semiconductor chip 81. The material of the underfill resin 85 may be, for example, an insulative resin such as the epoxy-based resin.

The external connection terminal 86 is formed on the external connection pad P2 of the wiring substrate 10. The external connection terminal 86 is, for example, used to electrically connect to the pad arranged on the mounting substrate such as the motherboard (not illustrated). A solder ball or a lead pin, for example, may be used as the external connection terminal 86. In the present example, the solder ball is used as the external connection terminal 86.

A method for manufacturing the wiring substrate 10 will now be described. Hereinafter, a method for simultaneously manufacturing a number of wiring substrates 10 in a large substrate (batch wiring substrate) and then singulating the large substrate into the wiring substrates 10 will be described.

First, in the step illustrated in FIG. 5A, the through holes 20X are formed in a copper clad laminate (CCL), for example, prepared as the core substrate 20. Next, the through electrodes 21 are formed in the through holes 20X through electrolytic plating, paste filling, or the like. Then, the wiring layer 22 is formed on the upper surface 20A of the core substrate 20 and the wiring layer 23 is formed on the lower surface 20B of the core substrate 20 through the subtractive process, for example. A large substrate, from which a number of wiring substrates 10 may be acquired, is used as the core substrate 20. That is, the core substrate 20 includes a plurality of regions A1, and a structural body corresponding to the wiring substrate 10 is acquired from each region A1. After the structural body corresponding to the wiring substrate 10 is formed in each region A1, the core substrate 20 is cut with a slicer or the like along a cutting line A2 to manufacture the plurality of wiring substrates 10.

Next, in the step illustrated in FIG. 5B, the insulation layer 31 is formed to cover the upper surface 20A of the core substrate 20 and the wiring layer 22, and the insulation layer 41 is formed to cover the lower surface 20B of the core substrate 20 and the wiring layer 23. When using a resin film as the insulation layers 31, 41, for example, the resin film is laminated on the upper surface 20A and the lower surface 20B of the core substrate 20. The resin film is thermally processed at a temperature (e.g., about 130 to 200° C.) higher than or equal to the curing temperature while pressed to cure the resin film and form the insulation layers 31, 41. In this case, the resin film is laminated in a vacuum atmosphere to prevent the formation of voids in the insulation layers 31, 41. A thermosetting resin film having a main component of an epoxy-based resin, for example, may be used as the resin film. A liquid or paste of insulative resin may be used as the insulation layers 31, 41. In this case, the liquid or paste of insulative resin is applied to the upper surface 20A and the lower surface 20B of the core substrate 20 through spin coating and the like. The insulative resin is then thermally processed at a temperature higher than or equal to the curing temperature to cure the insulative resin and form the insulation layers 31, 41. A thermosetting resin having a main component of an epoxy-based resin, for example, may be used as the liquid or paste of insulative resin.

A roughening process may be performed on the wiring layers 22, 23 before forming the insulation layers 31, 41. The roughening of the surfaces of the wiring layers 22, 23 increases the adhesiveness of the insulation layers 31, 41 and the wiring layers 22, 23. The roughening process includes, for example, a blackening process, an etching process, plating, blasting, and the like.

In the step illustrated in FIG. 5C, the through holes 31X are formed at predetermined locations of the insulation layer 31 to expose portions of the upper surface of the wiring layer 22, and the through holes 41X are formed at predetermined locations of the insulation layer 41 to expose portions of the lower surface of the wiring layer 23. The through holes 31X, 41X may be formed, for example, by performing laser processing using a $CO_2$ laser, a UV-YAG laser, or the like. If the through holes 31X, 41X are formed by the laser processing, a desmear process is performed to remove resin smear from the exposed surfaces of the wiring layers 22, 23 exposed through the through holes 31X, 41X.

In the step illustrated in FIG. 6A, the via wirings filled in the through holes 31X of the insulation layer 31 are formed, and the wiring layer 32 electrically connected to the wiring layer 22 through the via wirings and stacked on the upper surface of the insulation layer 31 is formed. Furthermore, the via wirings filled in the through hole 41X of the insulation layer 41 are formed, and the wiring layer 42 electrically connected to the wiring layer 23 through the via wirings and stacked on the lower surface of the insulation layer 41 is formed. The wiring layers 32, 42 may be formed, for example, using various types of wiring forming methods such as an semi-additive process and a subtractive process.

The steps similar to the steps illustrated in FIGS. 5B to 6A are then executed to stack the insulation layer 33 and the wiring layer 34 on the upper surface of the insulation layer 31 and to stack the insulation layer 43 and the wiring layer 44 on the lower surface of the insulation layer 41, as illustrated in FIG. 6B.

In the step illustrated in FIG. 7A, the steps similar to the steps illustrated in FIGS. 5B and 5C are executed to stack the insulation layer 35 including the through holes 35X on the upper surface of the insulation layer 33 and to stack the insulation layer 45 including the through holes 45X on the lower surface of the insulation layer 43.

If the through holes 35X, 45X are formed by through laser processing, the desmear process is performed to remove resin smear from the exposed surfaces of the wiring layers 34, 44 exposed through the through holes 35X, 45X. The wall surface of the through hole 35X and the upper surface 35A of the insulation layer 35 are roughened, and the wall surface of the through hole 45X and the lower surface of the insulation layer 45 are roughened by the desmear process.

In the step illustrated in FIG. 7B, the via wirings filling the through holes 45X of the insulation layer 45 are formed, and the wiring layer 46 electrically connected to the wiring layer 44 through the via wirings and stacked on the lower surface of the insulation layer 45 is formed. The wiring layer 46, for example, may be formed through various types of wiring formation processes such as a semi-additive process and a subtractive process.

In the step illustrated in FIG. 7B, the seed layer (not illustrated) that covers the entire surface of the insulation layer 35 including the inner surface of the through hole 35X is formed, and a electrolytic plating is performed using the seed layer as the power supplying layer. For example, the seed layer is formed through non-electrolytic copper plating, and electrolytic copper plating is performed using the seed layer as the power supplying layer. A conductive layer 91 is formed as the copper plated layer. The conductive layer 91 fills the through hole 35X and covers the entire upper surface 35A of the insulation layer 35.

The conductive layer 91 formed on the upper surface 35A of the insulation layer 35 is polished using, for example, the Chemical Mechanical Polishing (CMP) and the like. In this polishing step, a portion of the upper surface 35A of the insulation layer 35 is further polished. Thus, as illustrated in FIG. 8A, the via wiring 36 is formed in the through hole 35X, and the upper end face 36A of the via wiring 36 is substantially flush with the upper surface 35A of the insulation layer 35. Furthermore, in the polishing step, a portion of the upper surface 35A of the insulation layer 35 is polished so that the upper surface 35A of the insulation layer 35 becomes a smooth surface from a roughened surface. For example, the surface roughness value Ra of the upper surface 35A of the insulation layer 35 before the polishing is about 300 to 400 nm, whereas the surface roughness value Ra of the upper surface 35A of the insulation layer 35 after the polishing is about 15 to 40 nm. In other words, the upper surface 35A of the insulation layer 35 is polished until the upper surface 35A of the insulation layer 35 is smoothened to have the surface roughness value Ra of about 15 to 40 nm. In this case, the wall surface of the through hole 35X remains in the roughened state, and thus the upper surface 35A of the insulation layer 35 has a lower surface roughness than the wall surface of the through hole 35X. Thus, the upper surface 35A of the insulation layer 35 and the upper end face 36A of the via wiring 36 become the polished surface, that is, the smooth surface in the polishing step.

The above manufacturing steps manufactures the structural body corresponding to the wiring structure 11 in each region A1. The steps illustrated in FIGS. 8B to 14A described below are steps for forming the wiring structure 12 on the insulation layer 35, and thus the illustration of the structure formed on the lower surface 20B of the core substrate 20 will be omitted in FIGS. 8B to 14A.

In the step illustrated in FIG. 8B, the seed layer 92 is formed so as to cover the entire upper surface 35A of the insulation layer 35 and the entire upper end face 36A of the via wiring 36. The seed layer 92 may be formed, for example, through sputtering or non-electrolytic plating. In the present example, the upper surface 35A of the insulation layer 35 is a smooth surface, and thus the seed layer 92 may be uniformly formed on the upper surface 35A through sputtering. That is, the upper surface of the seed layer 92 may be formed smooth. In other words, the seed layer 92 may be formed to be thinner than when forming the seed layer 92 on the roughened surface through sputtering. For example, when forming the seed layer 92 through sputtering, titanium (Ti) is first deposited by sputtering on the upper surface 35A of the insulation layer 35 and the upper end face 36A of the via wiring 36 to form a Ti layer that covers the upper surface 35A and the upper end face 36A. Thereafter, copper is deposited on the Ti layer through sputtering to form a Cu layer. A seed layer 92 having a dual-layer structure (Ti/Cu layer) is thereby formed. The thickness of the Ti layer is about 20 to 50 nm, for example, and the thickness of the Cu layer is about 100 to 300 nm, for example. Thus, the adhesiveness of the insulation layer 35 and the seed layer 92 may be increased by providing the Ti layer as the lower layer in the seed layer 92. The Ti layer may be changed to a TiN layer containing titanium nitride (TiN) so that the seed layer 92 has a dual-layer structure including a TiN/Cu layer. Titanium and titanium nitride are metals having higher corrosion resistance than copper. These metals have higher adhesiveness with the insulation layer 35 than copper. When forming the seed layer 92 using the non-electrolytic plating, for example, the seed layer 92 including the Cu layer (one-layer structure) may be formed, for example, through non-electrolytic copper plating.

Before forming the seed layer 92, plasma processing such as $O_2$ plasma ashing may be performed on the upper surface 35A of the insulation layer 35. The upper surface 35A of the insulation layer 35 may be roughened by performing the plasma processing. The adhesiveness of the seed layer 92 and the insulation layer 35 may be increased by roughening the upper surface 35A of the insulation layer 35. However, since the fine wiring may be formed on the upper surface 35A by reducing the roughness of the upper surface 35A of the insulation layer 35 and increasing the smoothness, the upper surface 35A of the insulation layer 35 is roughened to an extent so that problems do not occur when forming the fine wiring in a step subsequent to the plasma process.

In the step illustrated in FIG. 9A, the resist layer 93 including opening patterns 93X, 93Y is formed at a predetermined location on the seed layer 92. The opening pattern 93Y exposes the seed layer 92 of the portion corresponding to the formation region of the wiring layer 50 (see FIG. 1). The opening pattern 93X exposes the seed layer 92 of the portion corresponding to the formation region of the plane layer 60 (see FIG. 1). In other words, the resist layer 93 covers the seed layer 92 of the portion corresponding to the through holes 60X, 60Y (see FIG. 1) formed in the plane layer 60. A material that resists plating in the plating process performed in the next step, for example, may be used as the material of the resist layer 93. For example, photosensitive dry film resist, liquid photoresist, or the like may be used for the resist layer 93. A novolac-based resin, acryl-based resin, and the like, for example, may be used as the material of the resist.

As illustrated in FIG. 9B, when using a photosensitive dry film resist, for example, as the resist layer 93, the dry film is laminated onto the upper surface of the seed layer 92 through thermo-compression bonding to form the resist layer 93. When using a liquid or paste of photoresist as the resist layer 93, a liquid or paste of photoresist is applied to the upper surface of the seed layer 92 through spin coating or the like to form the resist layer 93.

Then, the opening patterns 93X, 93Y are formed extending through certain locations of the resist layer 93 in the thickness-wise direction and exposing the upper surface of the seed layer 92 as illustrated in FIG. 9C through a photolithography process, for example. As a result, the resist layer 93 has a substantially trapezoidal shape cross-section so that the width L3 of the upper surface is smaller than the width L4 of the lower surface. In other words, the opening patterns 93X, 93Y have a substantially inverted trapezoidal cross-section so that the open width D3 of the upper open end is larger than the open width D4 of the lower open end. In other words, the opening patterns 93X, 93Y are tapered so that the lower opening is smaller than the upper opening. For example, the cross-sectional shapes of the resist layer 93 and the opening patterns 93X, 93Y may be adjusted by adjusting the exposure amount (exposure time), the developing time, and the like during the photolithography process. For example, if the resist layer 93 is the positive-type resist, the upper opening of each opening pattern 93X, 93Y may be enlarged to be larger than the lower opening by decreasing the exposure amount and setting a short developing time. Since the upper surface of the seed layer 92 is a smooth surface, the occurrence of patterning defects may be reduced in the resist layer 93 formed on the seed layer 92. In other words, the opening patterns 93X, 93Y may be formed with a high accuracy in the resist layer 93.

In the steps illustrated in FIGS. 10A and 10B, electrolytic plating using the seed layer 92 as the plating power supplying layer is performed while using the resist layer 93 as a plating mask. That is, electrolytic plating (electrolytic copper plating herein) is performed on the upper surface of the seed layer 92 exposed from the opening patterns 93X, 93Y of the resist layer 93. Thus, the metal layer 50B (electrolytic plated metal layer) is formed on the upper surface of the seed layer 92 exposed from the opening pattern 93Y, and the metal layer 60B (electrolytic plated metal layer) is formed on the upper surface of the seed layer 92 exposed from the opening pattern 93X. In this case, the metal layers 50B, 60B have a substantially inverted trapezoidal cross-section so that the width of the upper surface is larger than the width of the lower surface, as illustrated in FIG. 10B.

Figure 11A:
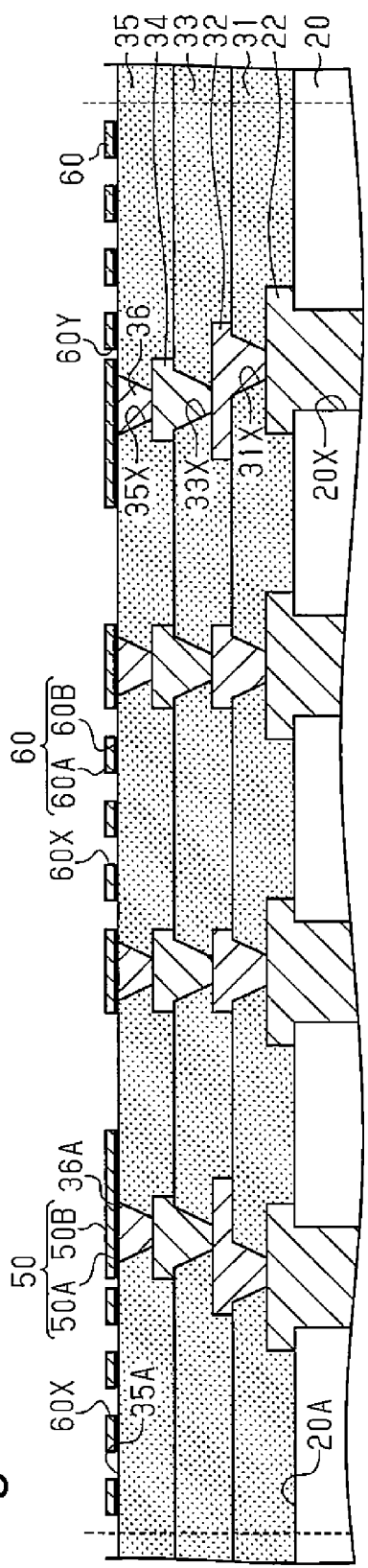
Figure 11B:
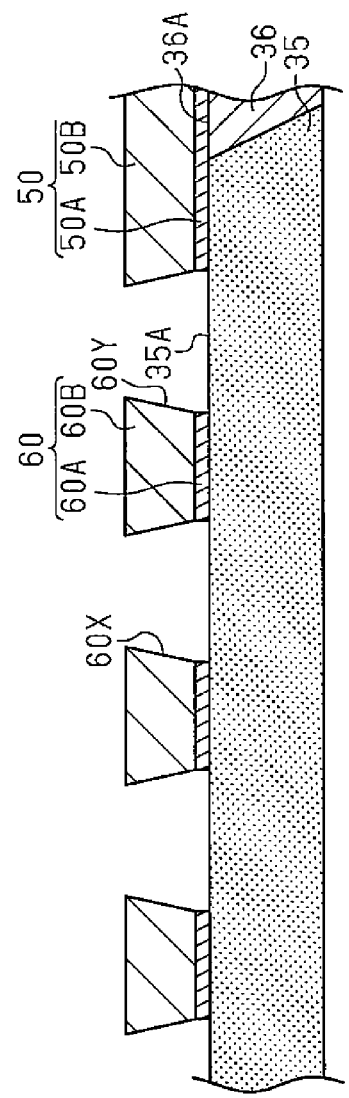

Then, the resist layer 93 is removed with an alkaline stripping solution, for example. The unnecessary seed layer 92 is then removed through etching using the metal layers 50B, 60B as an etching mask. As illustrated in FIGS. 11A and 11B, this forms the wiring layer 50 on the upper end face 36A of the via wiring 36 and the upper surface 35A of the insulation layer 35. Furthermore, the plane layer 60 is substantially grid-shaped in a plan view on the upper surface 35A of the insulation layer 35 exposed from the wiring layer 50. As illustrated in FIG. 11B, the wiring layer 50 includes the seed layer 50A joined with the upper end face 36A of the via wiring 36 and the metal layer 50B formed on the seed layer 50A. The plane layer 60 includes the seed layer 60A formed on the upper surface 35A and the metal layer 60B formed on the seed layer 60A. Thus, the wiring layer 50 and the plane layer 60 are formed through a semi-additive process. In this step, the through holes 60X, 60Y are formed where the resist layer 93 was formed.

In the step illustrated in FIG. 12A, the insulation layer 51 including the through hole 51X that partially exposes the upper surface of the wiring layer 50 is formed on the upper surface 35A of the insulation layer 35. As illustrated in FIG. 12B, the through holes 60X, 60Y are filled with the insulation layer 51 so that the insulation layer 51 entirely covers the side surface of the wiring layer 50 and the side surface of the plane layer 60. In this case, the characteristics of the insulation layer 51 for filling the through hole 60X deteriorates as the open width D1 of the upper open end of the through hole 60X becomes smaller. Thus, the open width D1 of the through hole 60X is set to be greater than the thickness T1 of the insulation layer 51 formed on the plane layer 60 in the present example. This allows the through hole 60X to be filled with the insulation layer 51 in a preferred manner.

For example, when using a resin film as the insulation layer 51, the resin film is laminated on the upper surface 35A of the insulation layer 35 through thermo-compression bonding, and the resin film is patterned by the photolithography process to form the insulation layer 51. In this case, the formation of voids in the insulation layer 51 may be prevented by laminating the resin film in a vacuum atmosphere. A film formed from a photosensitive resin such as phenol-based resin and polyimide-based resin, for example, may be used as the resin film. Furthermore, when using a liquid or paste of insulative resin a the insulation layer 51, the liquid or paste of insulative resin is applied to the upper surface 35A of the insulation layer 35 through a spin coating process or the like, and the insulative resin is patterned in a photolithography process to form the insulation layer 51. A photosensitive resin of a phenol-based resin, polyimide-based resin, and the like, for example, may be used as the liquid or paste of insulative resin.

The roughness of the upper surface of the insulation layer 51 formed from such a photosensitive resin is, for example, about 2 to 10 nm in surface roughness value Ra. In other words, the roughness of the upper surface of the insulation layer 51 is lower than the roughness of the wall surface of the through hole 35X and lower than the roughness of the upper surface 35A of the insulation layer 35.

Figure 13A:
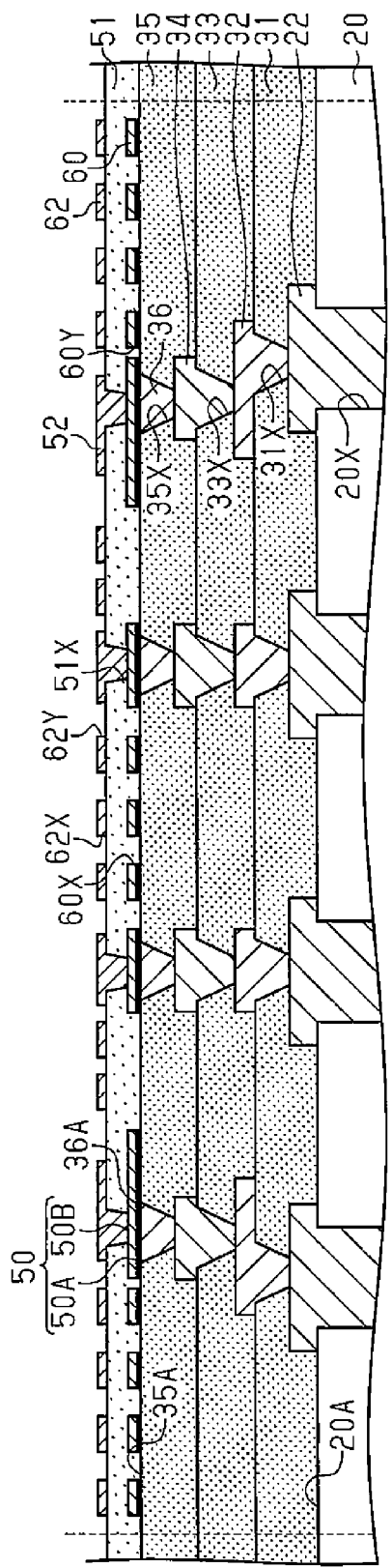
Figure 13B:
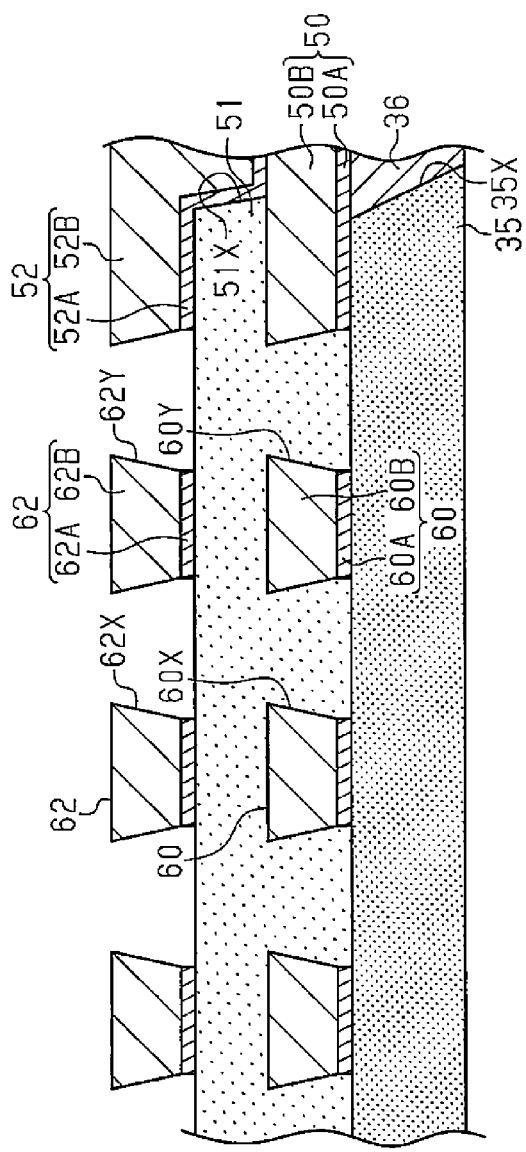

Then, in the step illustrated in FIG. 13A, the via wiring filling the through hole 51X, the wiring layer 52 electrically connected to the wiring layer 50 by the via wiring and stacked on the insulation layer 51, and the plane layer 62 stacked on the insulation layer 51 are formed. As illustrated in FIG. 13B, the wiring layer 52 and the via wiring each include a seed layer 52A, which covers the inner surface of the through hole 51X and the upper surface of the insulation layer 51 around the through hole 51X, and a metal layer 52B (electrolytic copper plated layer), which is formed on the seed layer 52A. The plane layer 62 includes a seed layer 62A formed on the upper surface of the insulation layer 51 and a metal layer 62B (electrolytic copper plated layer) formed on the seed layer 62A. In this case, the plane layer 62 (in particular, metal layer 62B) has a substantially inverted trapezoidal cross-section so that the width of the upper surface is larger than the width of the lower surface like the plane layer 60. The through holes 62X, 62Y of the plane layer 62 are tapered so that the upper opening becomes smaller than the lower opening.

The wiring layer 52 and the plane layer 62 may be formed through a semi-additive process, for example, in the same manner as the steps illustrated in FIGS. 8B to 11B. The seed layers 52A, 62A may be formed by performing sputtering or non-electrolytic plating, for example, in the same manner as the seed layer 92 (seed layers 50A, 60A).

In the step illustrated in FIG. 14A, the insulation layer 53 including the through hole 53X that partially exposes the upper surface of the wiring layer 52 is formed on the insulation layer 51, in the same manner as the steps illustrated in FIGS. 12A and 12B. The through holes 62X, 62Y are filled with the insulation layer 53 so that the insulation layer 53 entirely covers the side surface of the wiring layer 52 and the side surface of the plane layer 62.

In the same manner as the steps illustrated in FIGS. 13A and 13B, the via wiring filling the through hole 53X, the wiring layer 54 electrically connected to the wiring layer 52 through the via wiring and stacked on the insulation layer 53, and the plane layer 64 stacked on the insulation layer 53 are formed through the semi-additive process, for example. As illustrated in FIG. 14B, the wiring layer 54 and the via wiring each include a seed layer 54A that covers the inner surface of the through hole 53X and the upper surface of the insulation layer 53 around the through hole 53X, and a metal layer 54B (electrolytic copper plated layer) formed on the seed layer 54A. The plane layer 64 includes a seed layer 64A formed on the upper surface of the insulation layer 53 and a metal layer 64B (electrolytic copper plated layer) formed on the seed layer 64A. In this case, the plane layer 64 (in particular, metal layer 64B) has a substantially inverted trapezoidal cross-section so that the width of the upper surface is larger than the width of the lower surface like the plane layer 60. The through holes 64X, 64Y of the plane layer 64 are tapered so that the upper opening is smaller than the lower opening. The seed layers 54A, 64A may be formed through sputtering or non-electrolytic plating, for example, in the same manner as the seed layer 92 (seed layers 50A, 60A).

In the same manner as the steps illustrated in FIGS. 12A and 12B, the insulation layer 55 including the through hole 55X that partially exposes the upper surface of the wiring layer 54 is formed on the insulation layer 53. The through holes 64X, 64Y are filled with the insulation layer 55 so that the insulation layer 55 entirely covers the side surface of the wiring layer 54 and the side surface of the plane layer 64.

Then, in the same manner as the steps illustrated in FIGS. 13A and 13B, the via wiring filling the through hole 55X and the wiring layer 56 electrically connected to the wiring layer 54 by the via wiring and stacked on the insulation layer 55 are formed through a semi-additive process, for example. The wiring layer 56 includes a seed layer 56A that covers the wall surface of the through hole 55X and the upper surface of the insulation layer 55 around the through hole 55X, and a metal layer 56B (electrolytic copper plated layer) formed on the seed layer 56A. A surface processed layer may be formed on the surface of the pad P1 of the wiring layer 56 when necessary. The seed layer 56A may be formed through sputtering or non-electrolytic plating, for example, in the same manner as the seed layer (seed layers 50A, 60A).

By the above manufacturing steps, the wiring structure 12 is stacked on the upper surface 35A of the uppermost insulation layer 35 of the wiring structure 11.

Figure 15:
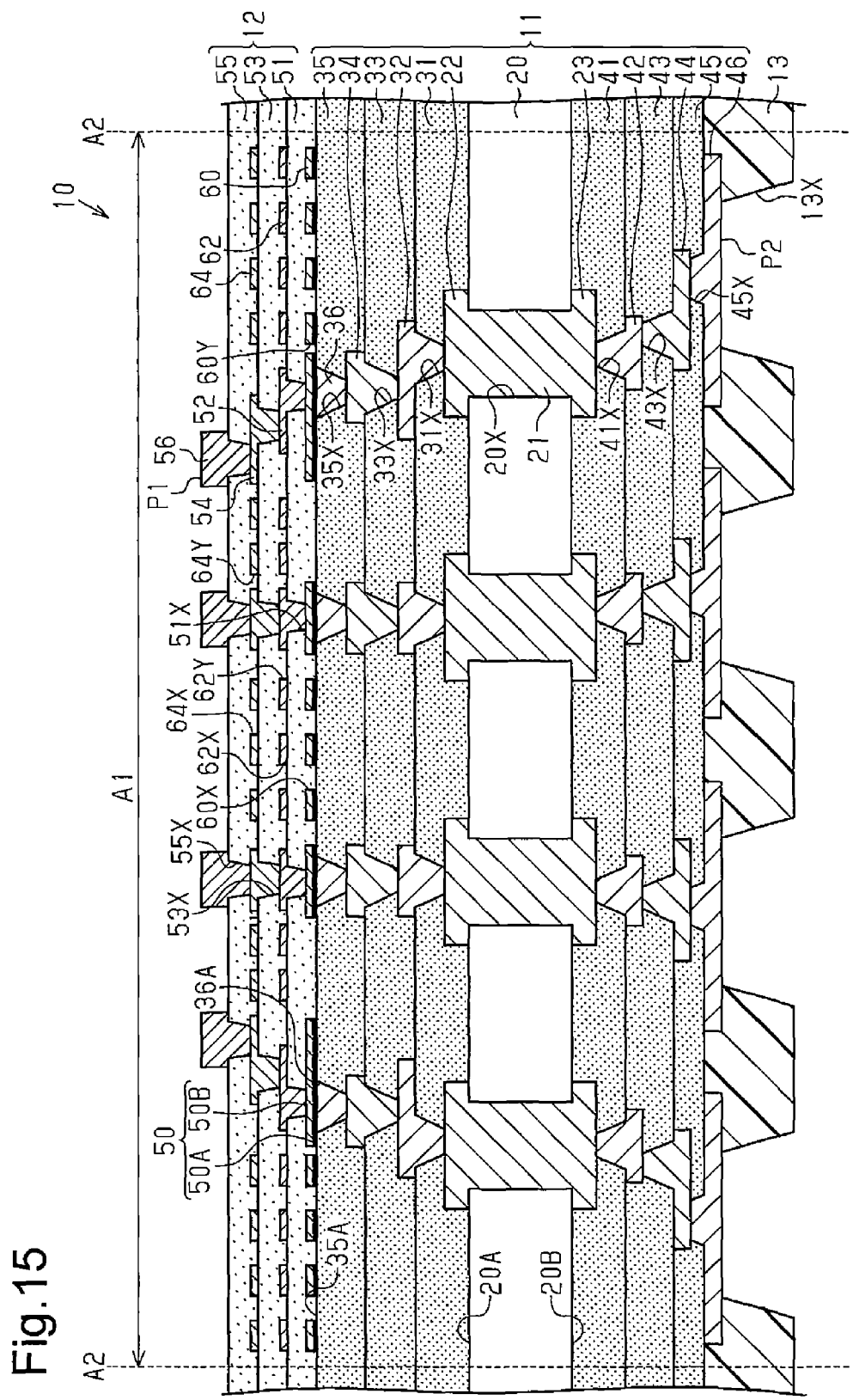

Then, in the step illustrated in FIG. 15, the solder resist layer 13 is stacked on the lower surface of the lowermost wiring layer 46 of the wiring structure 11. The solder resist layer 13 includes an opening 13X for exposing a certain location of the wiring layer 46 as the external connection pad P2. The thickness of the solder resist layer 13 (thickness from the lower surface of the insulation layer 45 to the lower surface of the solder resist layer 13) is set to be greater than or equal to the thickness of the wiring structure 12 (thickness from the upper surface 35A of the insulation layer 35 to the upper surface of the insulation layer 55). The solder resist layer 13 is formed from a photosensitive phenol-based resin or a polyimide-based resin. The solder resist layer 13 may be formed, for example, by laminating a photosensitive solder resist film or applying a liquid solder resist, and patterning the resist to a required shape. This exposes a portion of the wiring layer 46 through the opening 13X of the solder resist layer 13 as the external connection pad P2.

The surface processed layer may be formed on the external connection pad P2 when necessary. The solder resist layer 13 may be formed at any time as long as the lowermost wiring layer 46 has been formed. For example, the solder resist layer 13 may be formed after the step illustrated in FIG. 6B.

By the above manufacturing steps, the structural body corresponding to the wiring substrate 10 is manufactured in each region A1.

Then, the structural body illustrated in FIG. 15 is cut along the cutting line A2 using a slicer or the like to obtain a plurality of wiring substrates 10.

A method for manufacturing the semiconductor device 70 will now be described.

Figure 16:
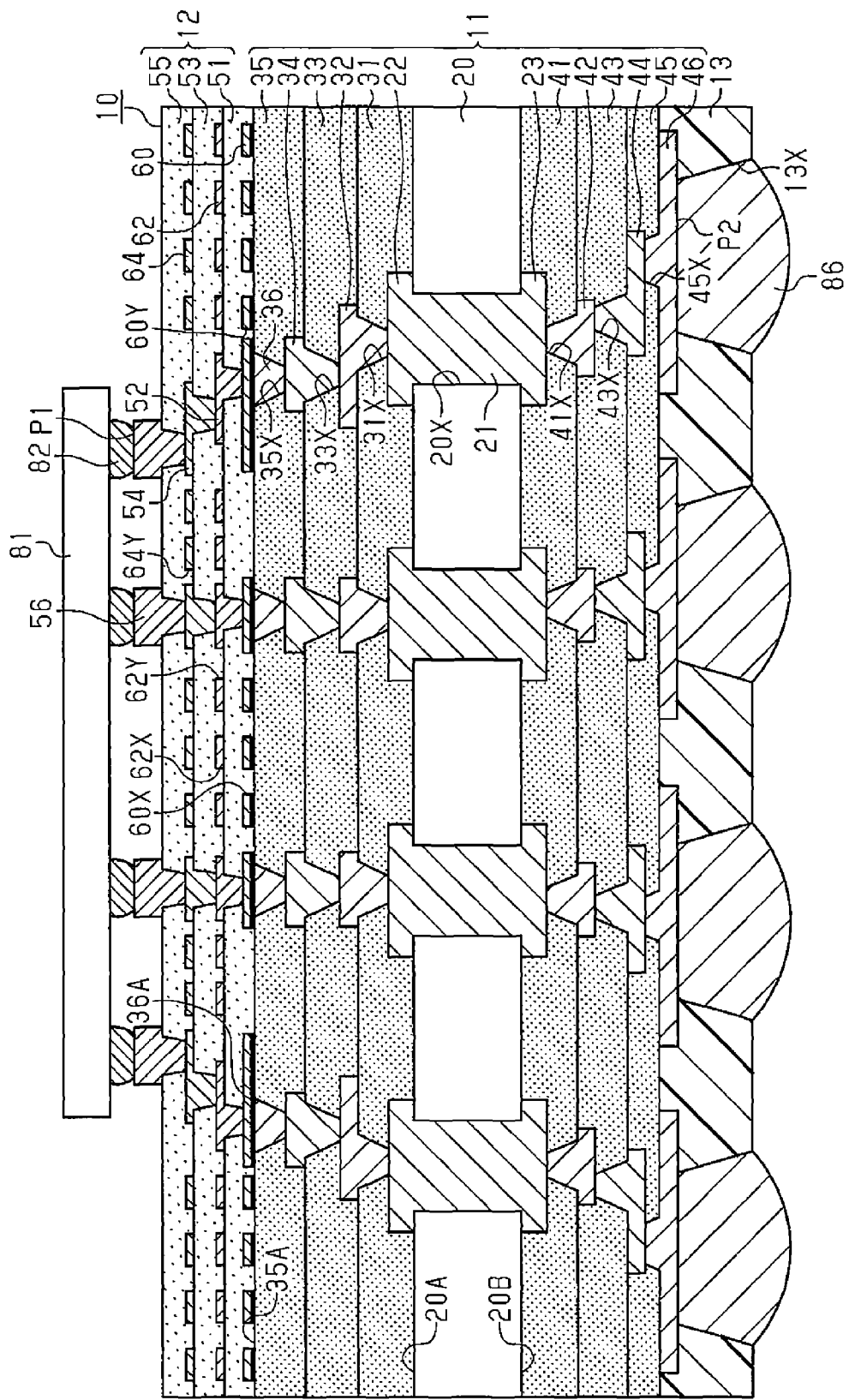
FIG. 16 is a schematic cross-sectional view illustrating a method for manufacturing the semiconductor device of FIG. 4.

In the step illustrated in FIG. 16, the external connection terminal 86 is formed on the external connection pad P2. For example, after applying flux to the external connection pad P2, the external connection terminal 86 (solder ball) is mounted, and the reflow process is performed at a temperature of about 240° C. to 260° C. This fixes the external connection terminal 86 to the external connection pad P2. Then, the surface is washed to remove unnecessary flux.

In the step illustrated in FIG. 16, the semiconductor chip 81 is mounted on the wiring substrate 10. In the present example, the bump 82 of the semiconductor chip 81 is flip-chip-joined with the pad P1 of the wiring substrate 10. Then, the underfill resin 85 (see FIG. 4) is filled between the semiconductor chip 81 and the wiring substrate 10, and the underfill resin 85 is cured. The semiconductor device 70 illustrated in FIG. 4 is manufactured through the manufacturing steps described above.

The first embodiment has the advantages described below.

(1) The through holes 60X are formed in the plane layer 60, and the insulation layer 51 is formed on the upper surface 35A of the insulation layer 35 so that the through holes 60X are filled with the insulation layer 51. This connects the insulation layers 35, 51 through the through holes 60X and increases the adhesiveness of the plane layer 60 and the insulation layers 35, 51. Further, the formation of the through holes 60X allows the plane layer 60 to have a fine mesh pattern instead of a solid pattern, which would easily cause separation of the plane layer 60 and the insulation layer 51. This limits defoliation of the insulation layer 51 from the plane layer 60.

(2) Each through hole 60X has a cross-sectional shape in which the open width D1 of the upper open end is smaller than the open width D2 of the lower open end. Thus, the through hole 60X is filled with the insulation layer 51 so that the insulation layer 51 is partially located under the side surface of the plane layer 60 (e.g., metal layer 60B). This improves the anchor effect and increases the adhesiveness of the insulation layer 51 and the plane layer 60. Thus, defoliation of the insulation layer 51 from the plane layer 60 is further limited.

(3) Defoliation of the insulation layer 51 from the plane layer 60 is limited in a preferred manner without performing a roughening process on the wiring layer 50. Since the roughening process of wiring layer 50 is omitted, the wiring layer 50 may easily be miniaturized.

(4) The open width D1 of the upper open end of the through hole 60X is set to be greater than the thickness T1 of the insulation layer 51 formed on the plane layer 60. Thus, a sufficient open width for filling each through hole 60X with the insulation layer 51 is ensured, and the insulation layer 51 fills each through hole 60X in a preferred manner.

(5) The upper surface 35A of the insulation layer 35 is smoother than the wall surface of the through hole 35X of the insulation layer 35. Thus, the metal film (e.g., seed layer 92) is uniformly formed on the upper surface 35A of the insulation layer 35 through, for example, sputtering. Accordingly, the seed layer 92 is thinner than when forming the seed layer 92 on the roughened surface. Moreover, the upper surface 35A of the insulation layer 35 is a smooth surface with few pits and valleys. This reduces the residual of the seed layer 92 when etching and removing the seed layer 92 as compared to when the upper surface 35A of the insulation layer 35 is a roughened surface including large pits and valleys. Therefore, the wiring layer 50 stacked on the upper surface 35A of the insulation layer 35 is easily miniaturized.

(6) The wiring substrate 10 includes the wiring structure 11 in which the insulation layer and the wiring layer are stacked symmetrically at the upper and lower sides of the core substrate 20. The wiring substrate 10, which is formed on the upper surface of the wiring structure 11, includes the wiring structure 12 having a stacked structure of the wiring layer, the plane layer, and the insulation layer. Further, the wiring substrate 10 includes the solder resist layer 13 formed on the lower surface of the wiring structure 11. Accordingly, the wiring substrate 10 has a structure that is asymmetric at the upper and lower sides of the wiring structure 11. Since the wiring density of the wiring layer 46 including the external connection pad P2 is low, the wiring density differs between the wiring layer 46 and the wiring structure 12. Thus, the wiring substrate 10 has a structure that is asymmetric at the upper and lower sides of the wiring structure 11. In such a vertically asymmetric structure, warping occurs relatively easily.

In the wiring substrate 10, the through holes 60X, 62X, and 64X are formed in the plane layers 60, 62, and 64 in the wiring structure 12. Thus, compared to when the plane layers 60, 62, and 64 are solid patterns, the volume of the plane layers 60, 62, and 64 is reduced, and the volume of the metal layer (wiring layers 50, 52, 54, and 56 and plane layers 60, 62, and 64) in the wiring structure 12 is reduced. This allows for the difference in the wiring density to be decreased between the wiring layer 46 arranged on the lower side of the lowermost insulation layer 45 in the wiring structure 11 and the wiring structure 12 arranged on the upper side of the uppermost insulation layer 35 in the wiring structure 11. Therefore, when the wiring substrate 10 is viewed in the vertical direction (thickness-wise direction), the distribution of the physical value (thermal expansion coefficient, elastic modulus, etc.) centered about the core substrate 20 approaches a vertically symmetric state. This reduces warping and undulation in the wiring substrate 10.

(7) The thickness of the solder resist layer 13 is set to be greater than or equal to the total thickness of each insulation layer in the wiring structure 12. Thus, the distribution of the physical value when viewing the wiring substrate 10 in the vertical direction (thickness-wise direction) approaches the vertically symmetric state at the upper and lower sides of the core substrate 20. This balances the physical value above and below the core substrate 20 and reduces warping and deformation of the wiring substrate 10 caused by thermal contraction or the like.

Second Embodiment

A second embodiment will now be described with reference to FIG. 17. The second embodiment differs from the first embodiment in that a wiring substrate 10A includes a wiring structure 11A instead of the wiring structure 11. The following description will focus on the differences from the first embodiment. Same reference numerals are given to those components that are the same as the corresponding components illustrated in FIGS. 1 to 16. Such components will not be described in detail.

Figure 17:
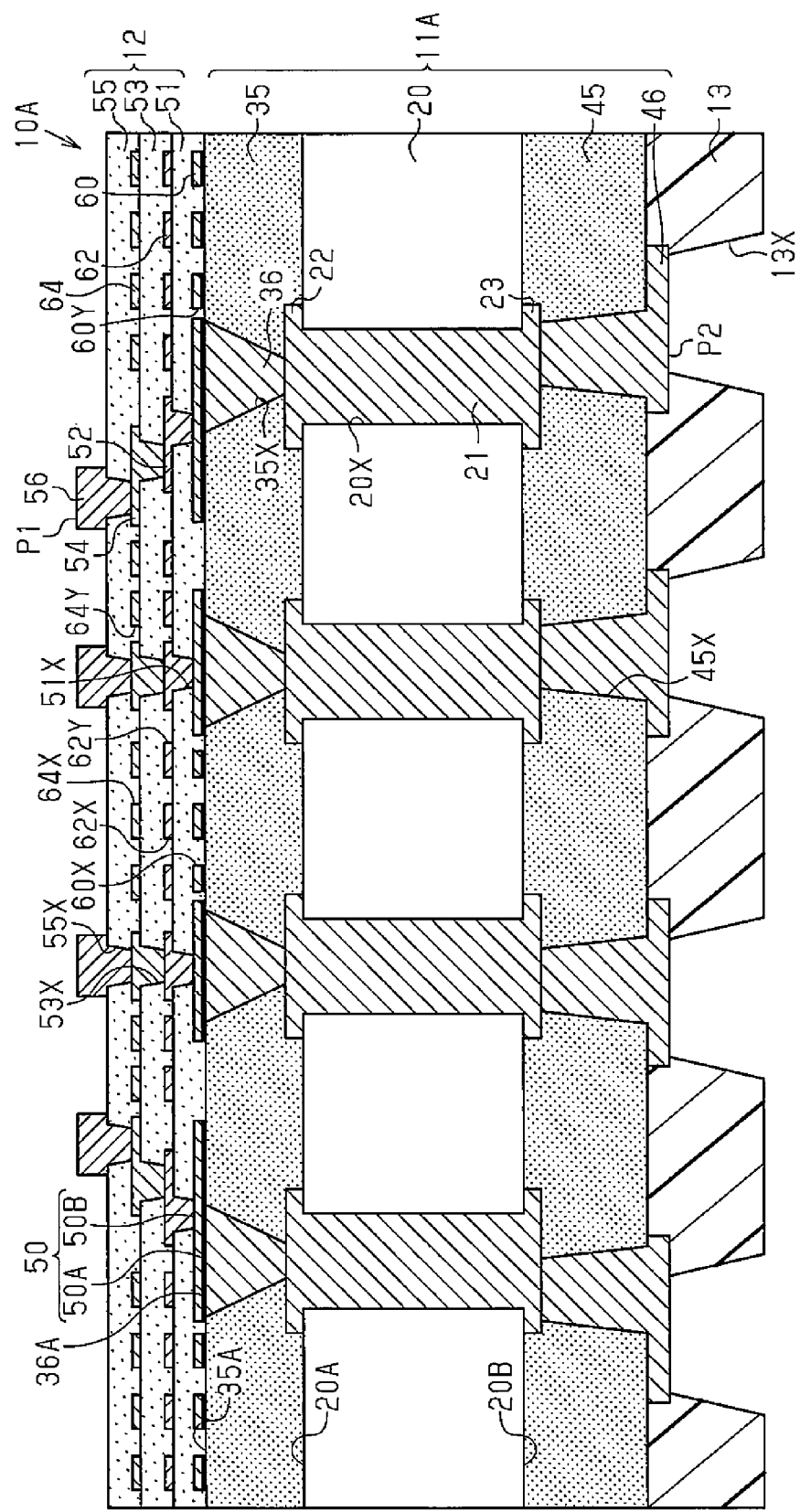
FIG. 17 is a schematic cross-sectional view illustrating a wiring substrate of a second embodiment.

As illustrated in FIG. 17, the wiring substrate 10A includes the wiring structure 11A, the wiring structure 12 stacked on the upper side of the wiring structure 11A, and the solder resist layer 13 stacked on the lower side of the wiring structure 11A.

The wiring structure 11A includes a low density wiring layer having a lower wiring density than the wiring structure 12. In the wiring structure 11A, the insulation layer 35 and the via wiring 36 are stacked on the upper surface 20A of the core substrate 20, and the insulation layer 45 and the wiring layer 46 are stacked on the lower surface 20B of the core substrate 20.

In the same manner as the core substrate 20, for example, an insulative resin obtained by impregnating a thermosetting resin in reinforcement material such as a glass cloth and the like may be used as the material of the insulation layers 35, 45. Each insulation layer 35, 45 is an insulation layer including reinforcement material having high mechanical strength (rigidity, hardness, etc.).

The insulation layer 35 includes through holes 35X that extend through the insulation layer 35 in the thickness-wise direction and partially expose the upper surface of the wiring layer 22. The via wiring 36 that electrically connects the wiring layer 22 and the wiring layer 50 of the wiring structure 12 is formed in each through hole 35X. The through hole 35X is filled with the via wiring 36.

The wiring structure 12 is stacked on the upper surface 35A of the insulation layer 35 and the upper end face 36A of the via wiring 36.

The insulation layer 45 includes through holes 45X that extend through the insulation layer 45 in the thickness-wise direction and partially expose the lower surface of the wiring layer 23. The wiring layer 46 is stacked on the lower surface of the insulation layer 45. The wiring layer 46 is electrically connected to the wiring layer 23 through the via wiring filling the through hole 45X.

Thus, advantages (1) to (7) of the first embodiment are obtained even if a single insulation layer and a single wiring layer are stacked on each of the upper and lower surfaces of the core substrate 20.

Third Embodiment

A third embodiment will now be described with reference to FIG. 18. The third embodiment differs from the first embodiment in that a wiring substrate 10B includes a wiring structure 11B instead of the wiring structure 11. The following description will focus on the differences from the first embodiment. Same reference numerals are given to those components that are the same as the corresponding components illustrated in FIGS. 1 to 17. Such components will not be described in detail.

Figure 18:
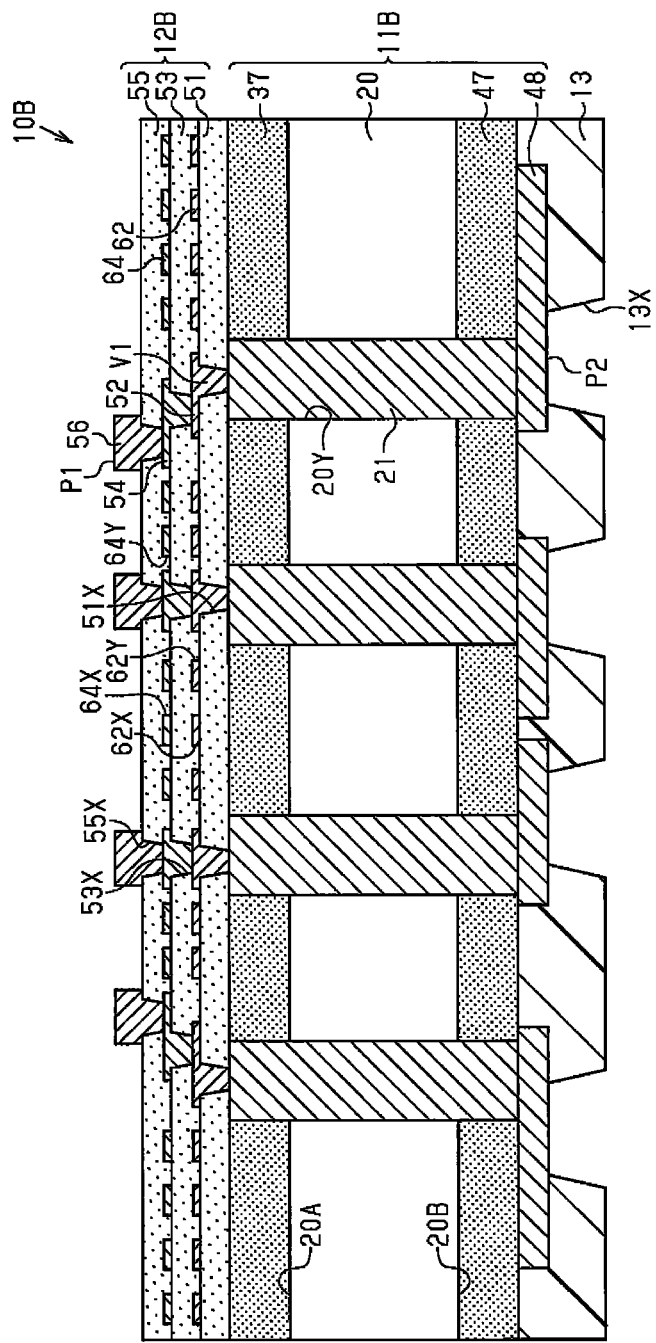
FIG. 18 is a schematic cross-sectional view illustrating a wiring substrate of a third embodiment.

As illustrated in FIG. 18, the wiring substrate 10B includes the wiring structure 11B, a wiring structure 12B stacked on the upper side of the wiring structure 11B, and the solder resist layer 13 stacked on the lower side of the wiring structure 11B.

The wiring structure 11B does not have a stacked structure in which the insulation layer and the wiring layer are stacked in multi-layers, and includes a low density wiring layer having a lower wiring density than the wiring structure 12B. In the wiring structure 11B, only the insulation layer 37 is stacked on the upper surface 20A of the core substrate 20, and the insulation layer 47 and the wiring layer 48 are stacked on the lower surface 20B of the core substrate 20. The insulation layer 37 serves as a first insulation layer. For example, a non-photosensitive and insulative resin of which the main component is a thermosetting resin such as epoxy-based resin and polyimide-based resin may be used as the material of the insulation layers 37, 47. The insulation layers 37, 47 may contain, for example, a filler such as silica, alumina, and the like. Copper and copper alloy, for example, may be used as the material of the wiring layer 48. The insulation layer 37 and the insulation layer 47 may, for example, have the same thickness. For example, the thickness of the insulation layers 37, 47 may be about 20 to 45 µm, and the thickness of the wiring layer 48 may be about 15 to 35 µm.

Through holes 20Y are formed in the core substrate 20 and the insulation layers 37, 47 so that each through hole 20Y extends through the core substrate 20 and the insulation layers 37, 47 in the thickness-wise direction. The through electrode 21 is formed in each through hole 20Y. In the present example, the through hole 20Y is filled with the through electrode 21. In other words, the through electrode 21 integrally includes the via wiring filling the through hole that extends through the insulation layer 37 in the thickness-wise direction, the through electrode filling the through hole that extends through the core substrate 20 in the thickness-wise direction, and the via wiring filling the through hole that extends through the insulation layer 47 in the thickness-wise direction. The upper end face of the through electrode 21 is exposed from the upper surface of the insulation layer 37, and the lower end face of the through electrode 21 is exposed from the lower surface of the insulation layer 47. For example, the upper end face of the through electrode 21 is substantially flush with the upper surface of the insulation layer 37, and the lower end face of the through electrode 21 is substantially flush with the lower surface of the insulation layer 47. The upper end face of the through electrode 21 is directly joined with the via wiring V1 integrally formed with the wiring layer 52 of the wiring structure 12B. The lower end face of the through electrode 21 is directly joined with the wiring layer 48.

The wiring structure 12B does not include the wiring layer 50 and the plane layer 60, and the lower end face of the via wiring V1 is directly joined with the upper end face of the through electrode 21. The insulation layer 51 covers the entire upper of the insulation layer 37. The wiring layer 52, which is integrally formed with the via wiring V1, and the plane layer 62 are stacked on the upper surface of the insulation layer 51.

The solder resist layer 13 is formed on the lower surface of the insulation layer 47 so as to cover the lowermost wiring layer 48. The solder resist layer 13 includes an opening 13X that partially exposes the wiring layer 48 as the external connection pad P2. The thickness of the solder resist layer 13 (thickness from the lower surface of the insulation layer 47 to the lower surface of the solder resist layer 13) is set to be greater than or equal to the thickness of the wiring structure 12B (thickness from the upper surface of the insulation layer 37 to the upper surface of the insulation layer 55).

In this manner, advantages (1) to (7) of the first embodiment are obtained even if multiple insulation layers and multiple wiring layers are not stacked in the wiring structure 11B.

Fourth Embodiment

A fourth embodiment will now be described with reference to FIG. 19. The fourth embodiment differs from the first embodiment in that a wiring substrate 10C includes a wiring structure 11C instead of the wiring structure 11. The following description will focus on the differences from the first embodiment. Same reference numerals are given to those components that are the same as the corresponding components illustrated in FIGS. 1 to 18. Such components will not be described in detail.

Figure 19:
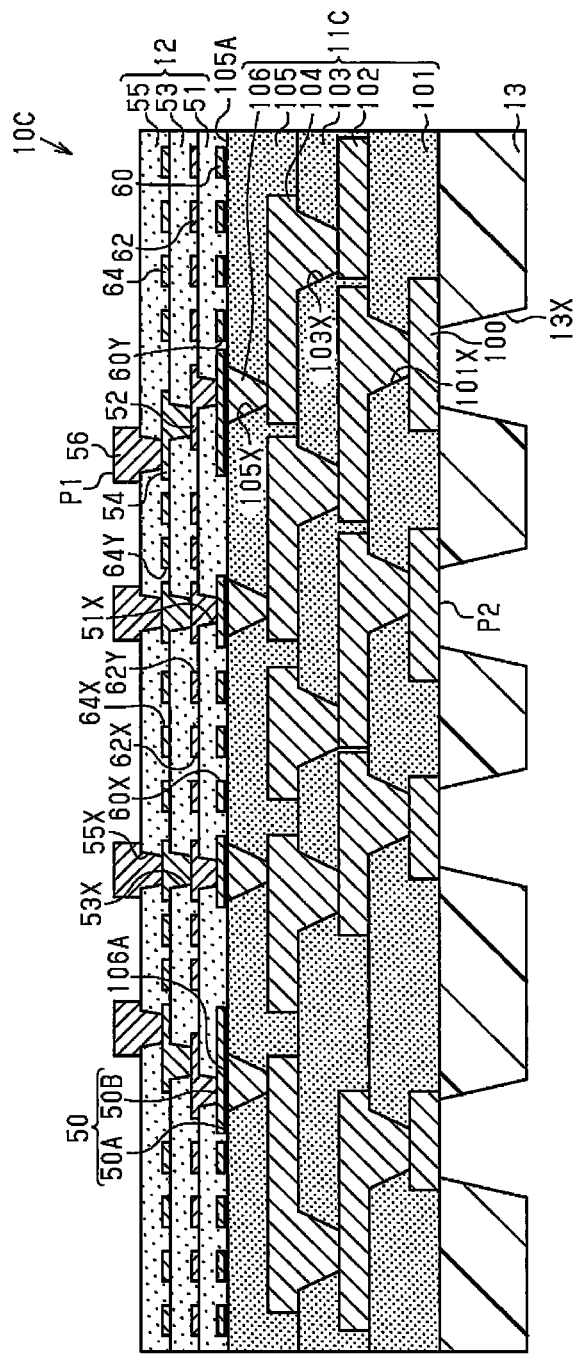
FIG. 19 is a schematic cross-sectional view illustrating a wiring substrate of a fourth embodiment.

As illustrated in FIG. 19, the wiring structure 11C does not have the core substrate 20 but includes a low density wiring layer having a lower wiring density than the wiring structure 12. The wiring structure 11C has a stacked structure in which a wiring layer 100, an insulation layer 101, a wiring layer 102, an insulation layer 103, a wiring layer 104, an insulation layer 105, and a via wiring 106 are sequentially stacked. For example, non-photosensitive and insulative resin of which the main component is a thermosetting resin such as an epoxy-based resin, a polyimide-based resin, and the like may be used as the material of the insulation layers 101, 103, 105. The insulation layers 101, 103, 105 may contain, for example, a filler such as silica, alumina, and the like. Copper and copper alloy, for example, may be used as the material of the wiring layers 102, 104 and the via wiring 106. The thickness of each insulation layer 101, 103, 105 is, for example, about 20 to 45 µm. The thickness of each wiring layer 100, 102, 104 is, for example, about 15 to 35 µm. The line and space (L/S) of the wiring layers 100, 102, 104 are, for example, about 20 µm/20 µm.

The wiring layer 100 is a lowermost wiring layer in the wiring structure 11C. For example, the lower surface of the wiring layer 100 is exposed from the insulation layer 101. The lower surface of the wiring layer 100 is, for example, substantially flush with the lower surface of the insulation layer 101. For example, a stacked structure of the first conductive layer (e.g., Cu layer) and the second conductive layer (e.g., Ni layer/Au layer) may be used as the wiring layer 100. In this case, the Au layer of the wiring layer 100 is exposed from the insulation layer 101.

The insulation layer 101 covers the upper surface and the side surface of the wiring layer 100 and exposes the lower surface of the wiring layer 100. The insulation layer 101 includes through holes 101X that extend through certain locations of the insulation layer 101 and partially expose the upper surface of the wiring layer 100.

The wiring layer 102 is stacked on the upper surface of the insulation layer 101. The wiring layer 102 is electrically connected to the wiring layer 100 through the via wiring filling the through hole 101X. For example, the wiring layer 102 is integrally formed with the via wiring filling the through hole 101X.

The insulation layer 103 is formed on the upper surface of the insulation layer 101 so as to cover the wiring layer 102. The insulation layer 103 includes through holes 103X that extends through certain locations of the insulation layer 103 in the thickness-wise direction and partially expose the upper surface of the wiring layer 102.

The wiring layer 104 is stacked on the upper surface of the insulation layer 103. The wiring layer 104 is electrically connected to the wiring layer 102 through the via wiring filling each through hole 103X. For example, the wiring layer 104 is integrally formed with the via wiring filling the through hole 103X.

The insulation layer 105 is formed on the upper surface of the insulation layer 103 so as to cover the wiring layer 104. The insulation layer 105 includes through holes 105X that open at certain locations in the upper surface of the insulation layer 105 and extend through the insulation layer 105 in the thickness-wise direction partially exposing the upper surface of the wiring layer 104.

Each through hole 101X, 103X, 105X is tapered so that the diameter decreases from the upper side (side closer to the wiring structure 12) toward the lower side (side closer to the solder resist layer 13) in FIG. 19. In other words, the through holes 101X, 103X, 105X of the wiring structure 11C are each formed such that the upper open end has a larger open diameter than the lower open end. The open diameter of the upper open end of each through hole 101X, 103X, 105X is, for example, about 60 to 70 μm.

The via wiring 106 that electrically connects the wiring layer 104 and the wiring layer 50 formed on the upper surface 105A of the insulation layer 105 is formed in each through hole 105X. In the present example, the through hole 105X is filled with the via wiring 106. Thus, the via wiring 106 has a shape similar to the through hole 105X. The upper end face 106A of the via wiring 106 is, for example, substantially flush with the upper surface 105A of the insulation layer 105.

The wiring structure 12 is stacked on the upper surface 105A of the insulation layer 105 and the upper end face 106A of the via wiring 106. For example, the wiring layer 50 of the wiring structure 12 is stacked on the upper surface 105A of the insulation layer 105 so as to be connected to the upper end face 106A of the via wiring 106. The plane layer 60 including the through holes 60X, 60Y is stacked on the upper surface 105A of the insulation layer 105. The upper surface 105A of the insulation layer 105 and the upper end face 106A of the via wiring 106 may be a polished surface, that is, a smooth surface, for example, like the upper surface 35A of the insulation layer 35 and the upper end face 36A (see FIG. 1) of the via wiring 36 of the first embodiment.

The solder resist layer 13 is formed on the lower surface of the insulation layer 101 so as to cover the lowermost wiring layer 100. The solder resist layer 13 includes an opening 13X that partially exposes the wiring layer 100 as the external connection pad P2.

Thus, advantages (1) to (5) and (7) of the first embodiment are obtained even if the wiring structure 11C does not have the core substrate 20.

The wiring structure 11C may be manufactured in the following manner through a known manufacturing method, which is not illustrated in the drawings. First, a temporary substrate serving as a supporting body is prepared, and the wiring layer 100, the insulation layer 101, the wiring layer 102, the insulation layer 103, the wiring layer 104, and the insulation layer 105 are sequentially stacked on the temporary substrate. Next, the via wiring 106 is formed in the insulation layer 105. This manufactures the structural body corresponding to the wiring structure 11C on the temporary substrate. After stacking the wiring structure 12 on the upper surface of the wiring structure 11C in the same manner as the steps illustrated in FIGS. 8B to 14B, the temporary substrate is removed. Then, the solder resist layer 13 is formed on the lower surface of the insulation layer 101, and the wiring substrate 100 is manufactured.

Fifth Embodiment

A fifth embodiment will now be described with reference to FIG. 20. A wiring substrate 10D of the fifth embodiment differs from the first embodiment in the structure of the uppermost wiring layer. The following description will focus on the differences from the first embodiment. Same reference numerals are given to those components that are the same as the corresponding components illustrated in FIGS. 1 to 19. Such components will not be described in detail.

Figure 20:
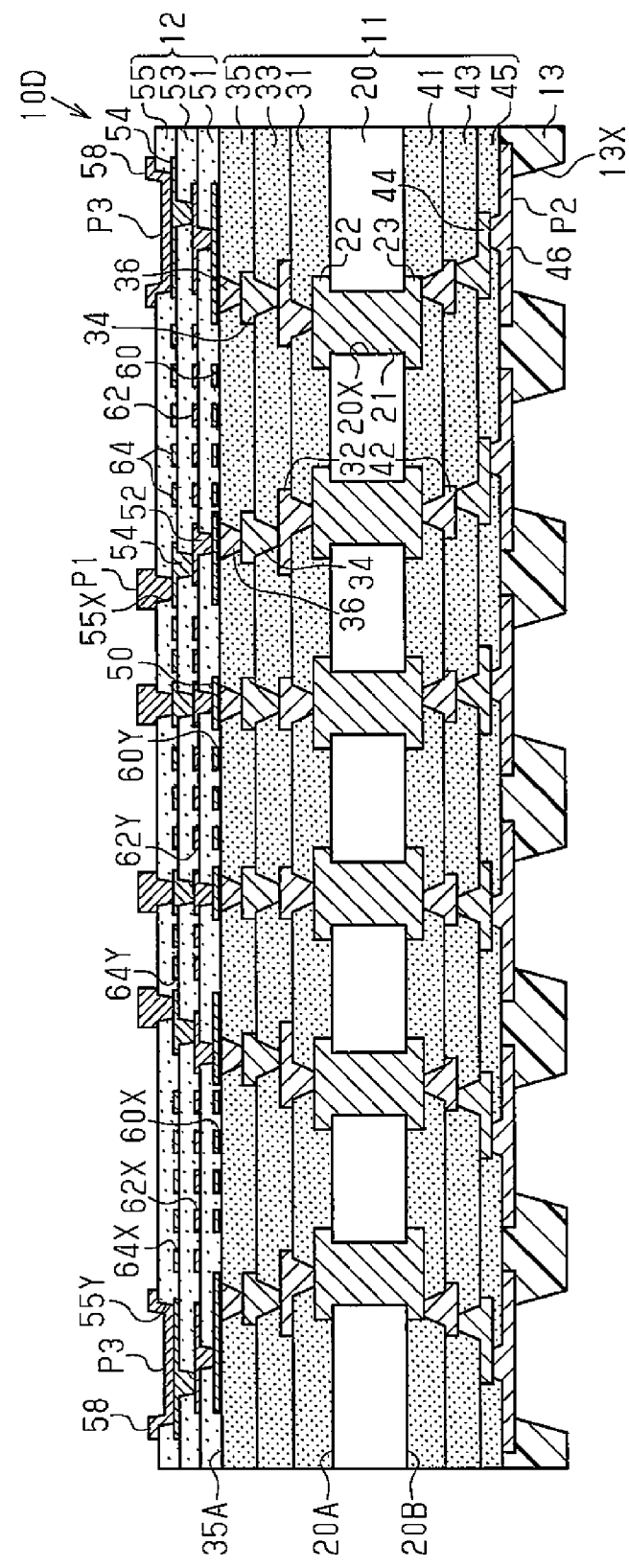
FIG. 20 is a schematic cross-sectional view illustrating a wiring substrate of a fifth embodiment.

As illustrated in FIG. 20, in the wiring substrate 10D, the wiring layer 58 is arranged on the uppermost insulation layer 55 in the wiring substrate 10 illustrated in FIG. 1 in addition to the wiring layer 56 including the pads P1. The wiring layer 58 includes connection pads P3 electrically connected to other wiring substrates and other semiconductor devices.

The wiring layer 58 is formed in through holes 55Y. Each through hole 55Y extends through the insulation layer 55 in the thickness-wise direction and partially exposes the upper surface of the wiring layer 54. The through holes 55Y are arranged in a region at the outer side of the through holes 55X. Each through hole 55Y, for example, has an inverted truncated conical shape in which the upper open end has a larger open diameter than the lower open end. The aspect ratio of the through hole 55Y is set to a value smaller than the through hole 55X. The aspect ratio of the through hole 55X may be, for example, about 0.05 to 0.1, and the aspect ratio of the through hole 55Y may be, for example, about 0.01 to 0.02.

The wiring layer 58 is formed along the side and bottom of the through hole 55Y, which has a small aspect ratio, and is extended to the upper surface of the insulation layer 55 from the inside of the through hole 55Y. In other words, the wiring layer 58 has a concave connection pad P3 formed in the through hole 55Y.

The connection pads P3 are, for example, formed in a region at the outer side of the pads P1. The connection pads P3 are, for example, arranged in the periphery of the upper surface of the uppermost insulation layer 55 in a plan view. Each connection pad P3 may have any planar shape and any size. The planar shape of each connection pad P3 is, for example, greater than the planar shape of the pad P1. For example, the planar shape of each connection pad P3 may be a circular shape having a diameter of about 120 to 170 μm.

In this manner, advantages (1) to (7) of the first embodiment are obtained by arranging the plane layers 60, 62, 64 in each layer of the wiring structure 12 even if the connection pads P3 are arranged in the wiring layer 56.

Figure 21:
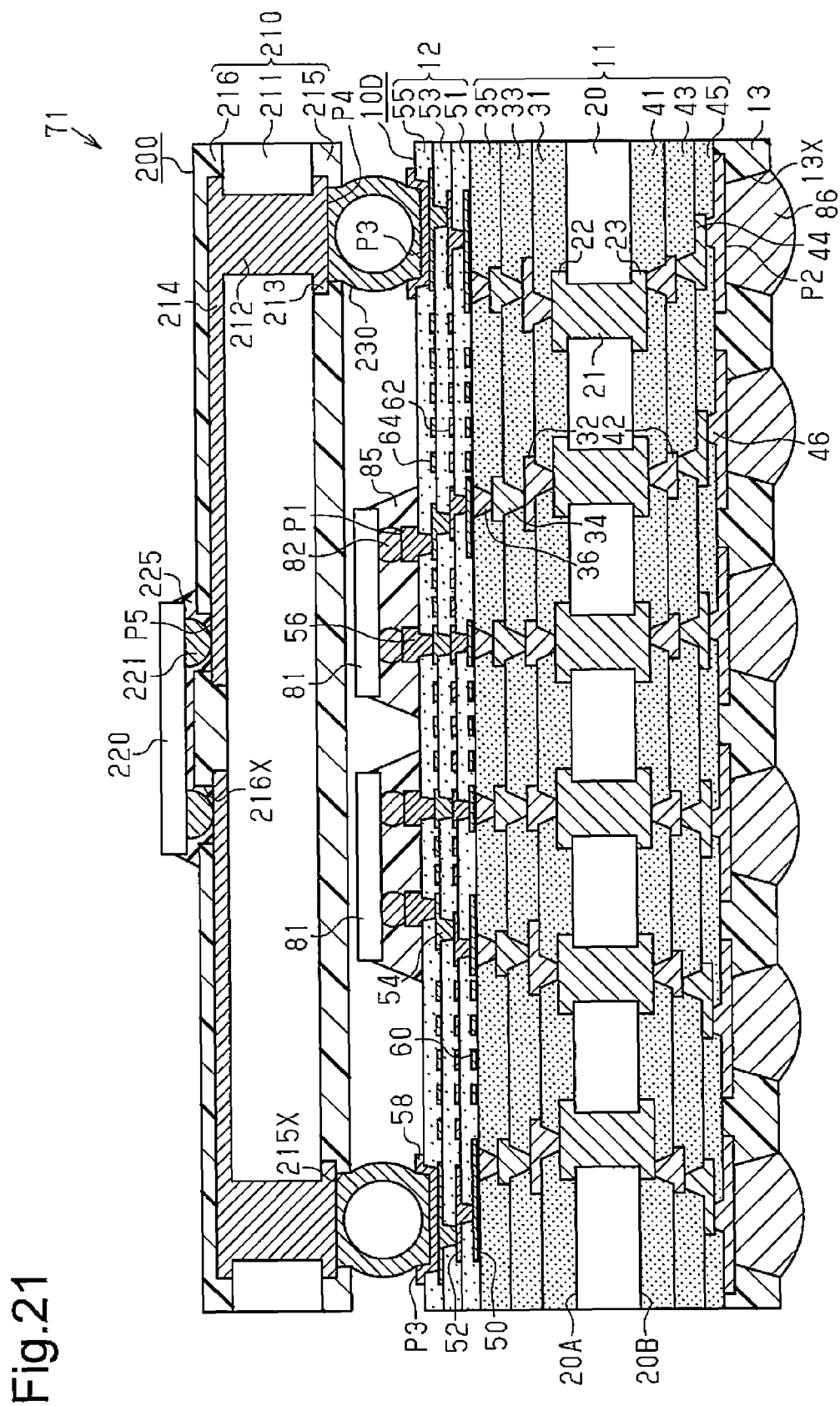
FIGS. 21 to 23 are schematic cross-sectional views illustrating various application examples of the wiring substrate of FIG. 20.
Figure 22:
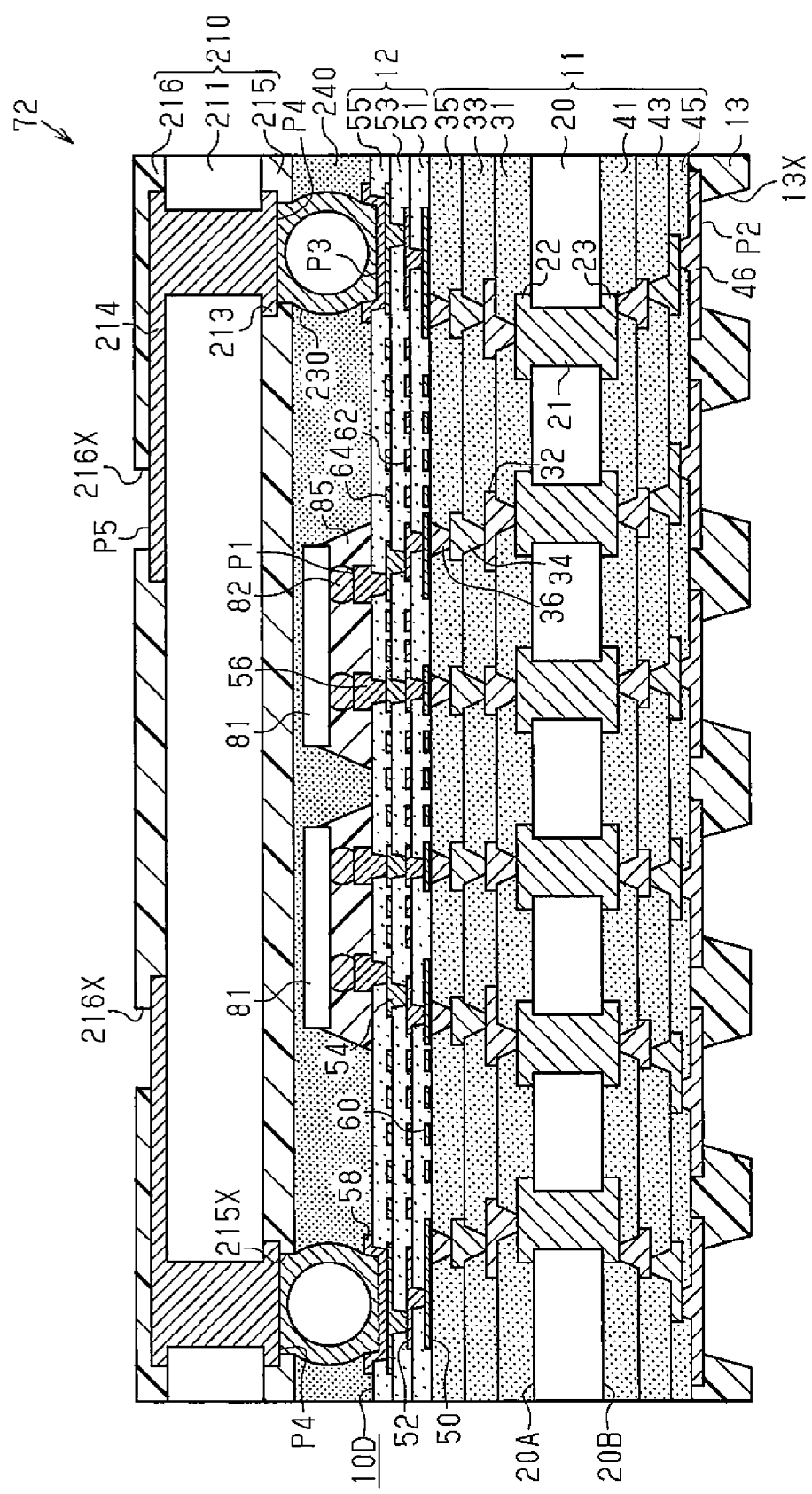
Figure 23:
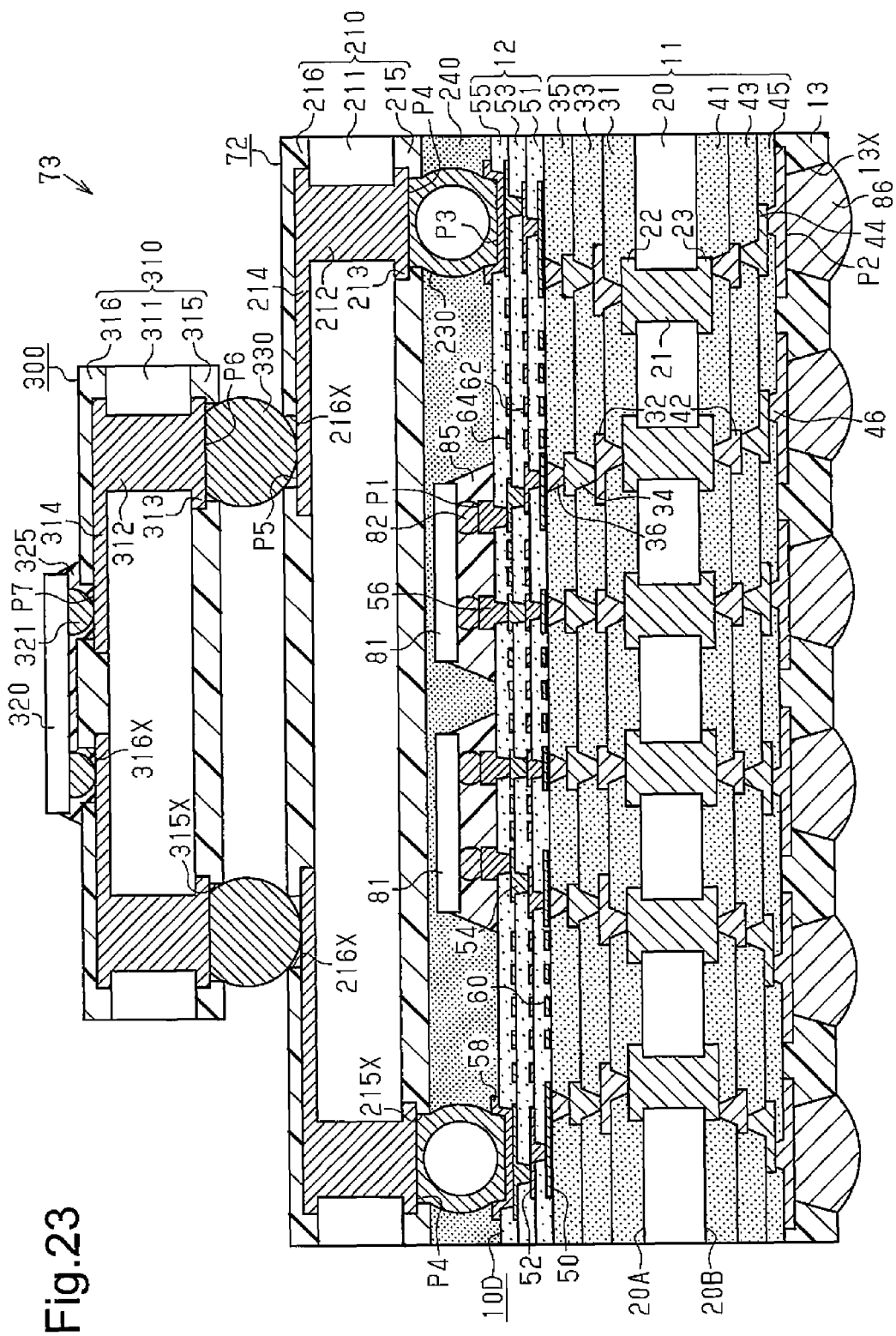

Application examples of the wiring substrate 10D will now be described with reference to FIGS. 21 to 23.

First Application Example

A semiconductor device 71 that mounts another semiconductor package 200 on the wiring substrate 10D will now be described with reference to FIG. 21.

The semiconductor device 71 includes the wiring substrate 10D, one or more (two in FIG. 21) semiconductor chips 81 mounted on the wiring substrate 10D, a semiconductor package 200 stacked on and joined with the wiring substrate 10D, and an external connection terminal 86.

The structure of the semiconductor package 200 will now be briefly described.

The semiconductor package 200 includes a wiring substrate 210, one or more semiconductor chips 220 mounted on the wiring substrate 210, and an underfill resin 225 formed between the wiring substrate 210 and the semiconductor chip 220.

The wiring substrate 210 includes a core substrate 211, a through electrode 212 arranged on the core substrate 211, a lowermost wiring layer 213 formed on the lower surface of the core substrate 211, an uppermost wiring layer 214 formed on the upper surface of the core substrate 211, and solder resist layers 215, 216. The wiring layers 213, 214 are electrically connected to each other by the through electrode 212.

The solder resist layer 215 is stacked on the lower surface of the core substrate 211 so as to partially cover the wiring layer 213. The solder resist layer 215 includes openings 215X exposing portions of the wiring layer 213 as connection pads P4. The connection pads P4, which are arranged to face the connection pads P3 of the wiring substrate 10D, are electrically connected to the connection pads P3.

The solder resist layer 216 is stacked on the upper surface of the core substrate 211 so as to partially cover the wiring layer 214. The solder resist layer 216 includes openings 216X exposing portions of the wiring layer 214 as pads P5. Each pad P5 functions as an electronic component mounting pad electrically connected to an electronic component such as a semiconductor chip, a passive element, and the like.

The wiring substrate 210 is not limited to the wiring substrate including the core substrate 211 and may be a coreless wiring substrate that does not include the core substrate 211.

The semiconductor chip 220 is flip-chip-mounted on the wiring substrate 210. Bumps 221 on the circuit formation surface (lower surface in FIG. 21) of the semiconductor chip 220 are joined with the pads P5 so that the semiconductor chip 220 is electrically connected to the wiring layer 214 by the bump 221. The underfill resin 225 is formed in a gap between the wiring substrate 210 and the semiconductor chip 220, which are flip-chip-joined.

Solder balls 230 are joined with the connection pads P3 of the wiring substrate 10D. The solder balls 230, which are located between the wiring substrate 10D and the semiconductor package 200, are joined with the connection pads P3, P4. For example, a conductive core ball (copper core ball, etc.) or a solder ball in which the a resin core ball is covered with solder may be used as the solder ball 230. Furthermore, a solder ball that does not include a core ball, such as a conductive core ball or a resin core ball, may be used as the solder ball 230.

Thus, the semiconductor device 71 has a Package on Package (POP) structure in which the wiring substrate 10D and the semiconductor package 200 are stacked on and joined with the solder balls 230.

Second Application Example

An example in which the wiring substrate 10D is applied to an electronic component built-in substrate 72 will now be described with reference to FIG. 22.

The electronic component built-in substrate 72 includes the wiring substrate 10D, one or more (two in FIG. 22) semiconductor chips 81 mounted on the wiring substrate 10D, another wiring substrate 210 mounted on the wiring substrate 10D, and an encapsulation resin 240 formed between the wiring substrate 10D and the wiring substrate 210.

In the electronic component built-in substrate 72, the wiring substrate 10D and the wiring substrate 210 are stacked on and joined with the solder balls 230. The space between the wiring substrate 10D and the wiring substrate 210 is filled with the encapsulation resin 240. The encapsulation resin 240 fixes the wiring substrate 210 to the wiring substrate 10D and encapsulates the semiconductor chip 81 mounted on the wiring substrate 10D. The encapsulation resin 240 functions as an adhesive that adheres the wiring substrate 10D to the wiring substrate 210. Further, the encapsulation resin 240 functions as a protective layer for protecting the semiconductor chip 81.

In the electronic component built-in substrate 72, the semiconductor chip 81, which is an electronic component, is incorporated between the wiring substrate 10D and the wiring substrate 210.

Third Application Example

A semiconductor device 73 in which another semiconductor package 300 is mounted on the electronic component built-in substrate 72 will now be described with reference to FIG. 23.

The semiconductor device 73 includes the electronic component built-in substrate 72 including the wiring substrate 10D, the semiconductor package 300 stacked on and joined with the electronic component built-in substrate 72, and the external connection terminal 86. The pads P5 formed on the wiring substrate 210 of the electronic component built-in substrate 72 are electrically connected to other wiring substrates and other semiconductor devices.

A structure of the semiconductor package 300 will now be briefly described.

The semiconductor package 300 includes a wiring substrate 310, one or more semiconductor chips 320 mounted on the wiring substrate 310, and an underfill resin 325 formed between the wiring substrate 310 and the semiconductor chip 320.

The wiring substrate 310 includes a core substrate 311, through electrodes 312 arranged in the core substrate 311, a lowermost wiring layer 313 formed on the lower surface of the core substrate 311, an uppermost wiring layer 314 formed on the upper surface of the core substrate 311, and solder resist layers 315, 316. The wiring layers 313, 314 are electrically connected to each other by the through electrodes 312.

The solder resist layer 315 is stacked on the lower surface of the core substrate 311 so as to cover a part of the wiring layer 313. The solder resist layer 315 includes openings 315X exposing portions of the wiring layer 313 as connections pad P6. The connection pads P6 are arranged to face the connection pads P5 of the electronic component built-in substrate 72 and are electrically connected to the connection pads P5.

The solder resist layer 316 is stacked on the upper surface of the core substrate 311 so as to partially cover the wiring layer 314. The solder resist layer 316 includes opening 316X exposing portions of the wiring layer 314 as pads P7. Each pad P7 functions as an electronic component mounting pad electrically connected to an electronic component such as a semiconductor chip, a passive element, and the like.

The wiring substrate 310 is not limited to the wiring substrate including the core substrate 311 and may be a coreless wiring substrate that does not include the core substrate 311.

The semiconductor chip 320 is flip-chip-mounted on the wiring substrate 310 as described above. Bumps 321 on the circuit formation surface (lower surface in FIG. 23) of the semiconductor chip 320 are joined with the pads P7 so that the semiconductor chip 320 is electrically connected to the wiring layer 314 by the bumps 321. The underfill resin 325 is formed between the wiring substrate 310 and the semiconductor chip 320, which are flip-chip-joined.

The semiconductor package 300 is stacked on and joined with the electronic component built-in substrate 72 through the solder balls 330. The solder balls 330, which are located between the electronic component built-in substrate 72 and the semiconductor package 300, are joined with the connection pads P5 of the electronic component built-in substrate 72 and also with the connection pad P6.

It should be apparent to those skilled in the art that the present invention may be embodied in many other specific forms without departing from the spirit or scope of the invention. Particularly, it should be understood that the present invention may be embodied in the following forms.

In each of the second to fourth embodiments, the connection pads P3 may be arranged on the uppermost wiring layer 56 in each wiring substrate 10A to 10C in the same manner as the wiring substrate 10D of the fifth embodiment.

Figure 24:
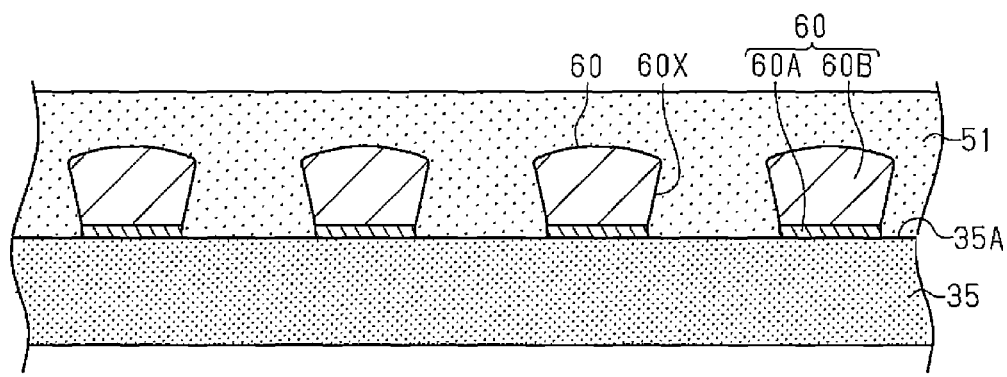
FIG. 24 is an enlarged cross-sectional view illustrating a plane layer of a modification.

As illustrated in FIG. 24, the upper surface of the plane layer 60 in each embodiment may be bulged. In other words, the upper surface of the plane layer 60 may be curved and upwardly bulged from the peripheral portion toward the central portion. This increases the fluidity of the insulative resin when forming the insulation layer 51 that covers the plane layer 60. Thus, the through holes 60X may be filled with the insulation layer 51 in a preferred manner. As a result, the flatness of the upper surface of the insulation layer 51 may be improved. The plane layers 62, 64 may also be changed in the same manner.

In each embodiment described above, each through hole 60X, 62X, 64X is tetragonal in a plan view. However, the planar shape of each of the through holes 60X, 62X, 64X is not particularly limited.

Figures 25A, 25B:
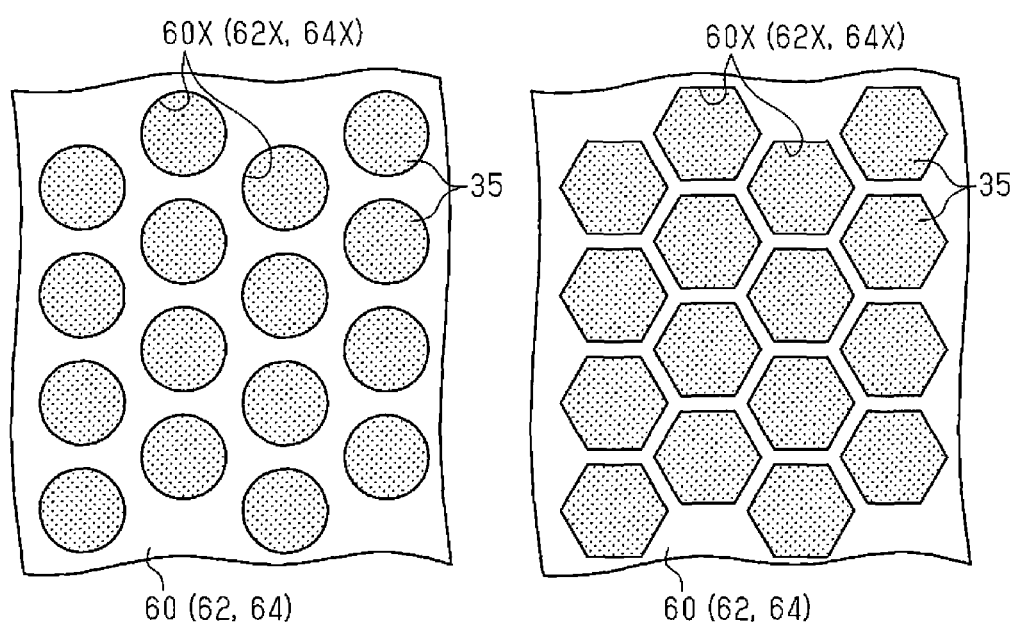
FIGS. 25A and 25B are schematic plan views illustrating a plane layer of another modification.

For example, as illustrated in FIG. 25A, the planar shape of each through hole 60X, 62X, 64X may be circular. Furthermore, as illustrated in FIG. 25B, the planar shape of each through hole 60X, 62X, 64X may be polygonal like a hexagon. Although not illustrated in the drawings, the planar shape of each through hole 60X, 62X, 64X may be elliptical or triangular.

In each embodiment described above, the through holes 60X, 62X, 64X are arranged in a matrix form in a plan view. Instead, for example, the through holes 60X, 62X, 64X may be arranged in a staggered manner in a plan view, as illustrated in FIGS. 25A and 25B.

Figure 26:
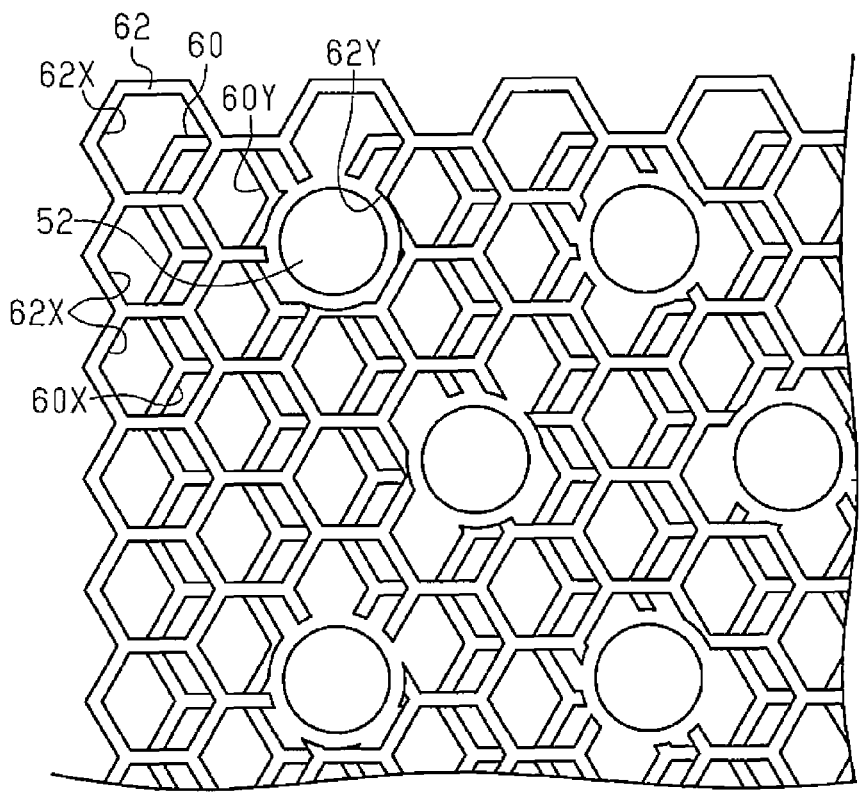
FIGS. 26 and 27 are schematic plan views illustrating a plane layer of a further modification.
Figure 27:
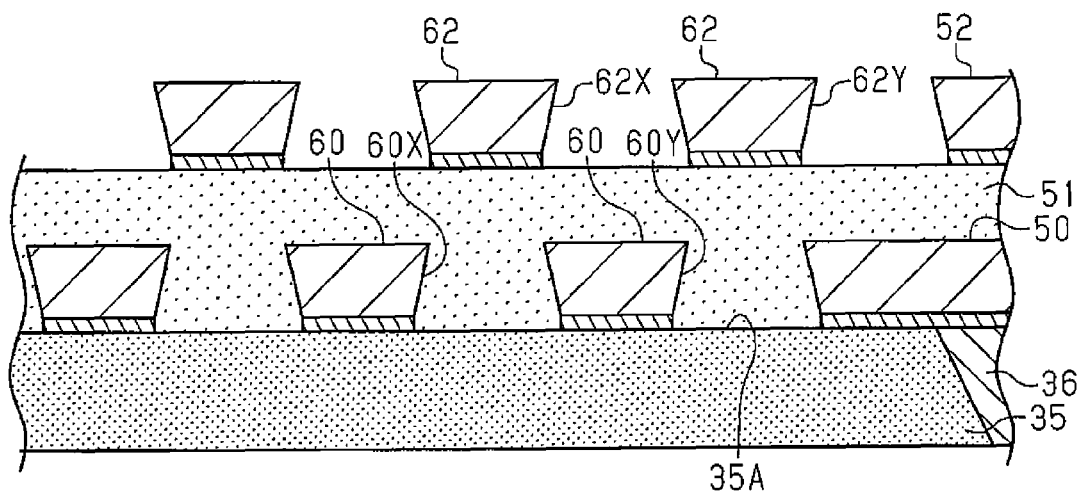

As illustrated in FIGS. 26 and 27, for example, the plane layers 60, 62, which are adjacent to each other in the vertical direction with the insulation layer 51 located in between, may be arranged at positions different from each other in a planar direction (direction orthogonal to the thickness-wise direction of the wiring structure 12 in a cross-sectional view). In this case, as illustrated in FIG. 27, the through holes 60X of the plane layer 60 are located at positions different from the through holes 62X of the plane layer 62 in a plan view. This disperses undulation in the planar direction on the upper surfaces of the insulation layers 51, 53, 55 in the wiring structure 12 originating from the through holes 60X, 62X, 64X. Therefore, the flatness of the upper surfaces of the insulation layer 51, 53, 55 may be improved. In FIG. 26, the insulation layers 35, 51 are not illustrated.

In each embodiment described above, only at least a portion of the plane layer 60 needs to be grid-shaped in a plan view. For example, a solid form or a land form pattern may be formed in a portion of the plane layer 60. The plane layers 62, 64 may also be changed in the same manner.

In each embodiment described above, the through hole 60X of the plane layer 60 is formed so that the open width D1 of the upper open end is smaller than the open width D2 of the lower open end (see FIG. 12B) by forming the opening pattern 93X of the resist layer 93 so that the open width D3 of the upper open end is larger than the open width D4 of the lower open end (see FIG. 9C). Instead, for example, the through hole 60X of the plane layer 60 may be formed so that the open width D1 of the upper open end becomes smaller than the open width D2 of the lower open end by adjusting the processing conditions (composition of etchant, processing time, etc.) when etching the seed layer 92 using the metal layers 50B, 60B as the mask.

In each embodiment described above, the thickness of the solder resist layer 13 is set to be greater than or equal to the thickness of the wiring structure 12. Instead, for example, the solder resist layer 13 may be thinner than the wiring structure 12.

In each embodiment described above, the upper end face 36A of the via wiring 36 is flush with the upper surface 35A of the insulation layer 35, and the upper end face 106A of the via wiring 106 is flush with the upper surface 105A of the insulation layer 105. Instead, for example, the upper end faces 36A, 106A of the via wirings 36, 106 may be recessed toward the lower side from the upper surfaces 35A, 105A of the insulation layers 35, 105. The upper end faces 36A, 106A of the via wirings 36, 106 may project toward the upper side than the upper surfaces 35A, 105A of the insulation layers 35, 105.

In each embodiment described above, the cross-sectional shape of the through hole formed in each wiring substrate 10, 10A to 10D is not particularly limited. For example, the through hole formed in each wiring substrate 10, 10A to 10D may have a straight shape (tetragonal cross-sectional).

In each embodiment described above, various changes and modifications may be made to the number of wiring layers and the number of insulation layers in each of the wiring structures 11, 11A to 11C, the wiring method in the wiring layers, and the like.

In each embodiment described above, various changes and modifications may be made to the number of wiring layers 50, 52, 54, 56 and the number of insulation layers 51, 53, 55 in each wiring structure 12, 12B, the wiring method in the wiring layers 50, 52, 54, 56, and the like.

In the first embodiment and the application examples of the fifth embodiment, the semiconductor chip 81 is mounted on the wiring substrates 10, 10D. Instead, for example, an electronic component other than the chip component such as a chip capacitor, a chip resistor, a chip inductor, and the like, and the semiconductor chip such as a crystal oscillator, and the like may be mounted on the wiring substrates 10, 10D instead of the semiconductor chip 81. An electronic component such as the semiconductor chip 81, and the like may be mounted on each wiring substrate 10A to 10C of the second to fourth embodiments.

Various changes and modifications may be made to the mounting scheme of electronic components such as the semiconductor chip 81, the chip component, the crystal oscillator, and the like (e.g., flip-chip mounting, wire-bonding mounting, solder mounting, or combination of these mounting schemes).

In each embodiment described above, the wiring layers arranged on the upper and lower surfaces of the core substrate 20 are electrically connected to each other by the through electrode 21 formed in the through hole 20X (or 20Y) of the core substrate 20. Instead, for example, the through hole plated layer may be arranged on the inner wall of the through hole 20X (or 20Y) as the through electrode, and the wiring layers on the upper and lower surfaces of the core substrate 20 may be electrically connected to each other by the through hole plated layer. In this case, the through hole plated layer defines a cavity in the through hole 20X (or 20Y), and the cavity may be filled with a resin.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
a first wiring structure; and
a second wiring structure stacked on an upper surface of the first wiring structure, wherein:
the first wiring structure includes
a first insulation layer, and
a via wiring that fills a first through hole extending through the first insulation layer in a thickness-wise direction, wherein the via wiring includes an upper end face exposed from an upper surface of the first insulation layer;
the second wiring structure includes
a first wiring layer formed on the upper surface of the first insulation layer and the upper end face of the via wiring,
a first plane layer stacked on the upper surface of the first insulation wherein the first plane layer is one of a power supply plane and a ground plane and is an at least partially grid-shaped conductive layer in a plan view to define second through holes extending through the first plane layer in the thickness-wise direction, wherein the partially grid-shaped conductive layer includes a seed layer and a plated metal layer; wherein a width of a top surface of the plated metal layer is greater than a width of the seed layer, and
a second insulation layer stacked on the upper surface of the first insulation layer, wherein the second insulation layer fills the second through holes and covers entire top and side surfaces of the first plane layer and entire top and side surfaces of the first wiring layer;
the second wiring structure has a higher wiring density than the first wiring structure; and
the second through holes each include an upper open end and a lower open end, wherein the upper open end has a smaller open width than the lower open end.

2. The wiring substrate according to claim 1, wherein the top surface of the first plane layer is curved and upwardly bulged from a peripheral portion toward a central portion.

3. The wiring substrate according to claim 1, wherein:
the second wiring structure further includes
a second wiring layer stacked on an upper surface of the second insulation layer and electrically connected to the first wiring layer,
a second plane layer stacked on the upper surface of the second insulation layer, wherein the second plane layer is at least partially grid-shaped in a plan view to define third through holes extending through the second plane layer in the thickness-wise direction, and
a third insulation layer stacked on the upper surface of the second insulation layer, wherein the third insulation layer fills the third through holes and covers the second plane layer and the second wiring layer;
the third through holes each include an upper open end and a lower open end, wherein the upper open end of each third through hole has a smaller open width than the lower open end of each third through hole; and
the first plane layer and the second plane layer are arranged at positions different from each other in a planar direction so that the second through holes of the first plane layer are located at positions different from the third through holes of the second plane layer in a plan view.

4. The wiring substrate according to claim 1, wherein
the first wiring layer includes a seed layer formed on the upper end face of the via wiring, and
the upper surface of the first insulation layer is flush with the upper end face of the via wiring.

5. The wiring substrate according to claim 1, wherein
the first wiring structure includes one or more insulation layers, each including a non-photosensitive resin as a main component; and
the second insulation layer of the second wiring structure includes a photosensitive resin as a main component and is thinner than each insulation layer of the first wiring structure.

6. The wiring substrate according to claim 1, wherein the open width of the upper open end of each of the second through holes is set to be greater than a thickness of the second insulation layer formed on the first plane layer.

7. A semiconductor device comprising:
a wiring substrate; and
a semiconductor chip mounted on the wiring substrate;
wherein the wiring substrate includes
a first wiring structure, and
a second wiring structure stacked on an upper surface of the first wiring structure, wherein:
the first wiring structure includes
a first insulation layer, and
a via wiring that fills a first through hole extending through the first insulation layer in a thickness-wise direction, herein the via wiring includes an upper end face exposed from an upper surface of the first insulation layer;
the second wiring structure includes
a first wiring layer formed on the upper surface of the first insulation layer and the upper end face of the via wiring,
a first plane layer stacked on the upper surface of the first insulation layer, wherein the first plane layer is one of a power supply plane and a ground plane and is an at least partially grid-shaped conductive layer in a plan view to define second through holes extending through the first plane layer in the thickness-wise direction, wherein the partially grid-shaped conductive layer includes a seed layer and a plated metal layer, wherein a width of a top surface of the plated metal layer is greater than a width of the seed layer, a second insulation layer stacked on the upper surface of the first insulation layer, wherein the second insulation layer fills the second through holes and covers entire top and side surfaces of the first plane layer and entire top and side surfaces of the first wiring layer, and an uppermost wiring layer electrically connected to the first wiring layer, wherein the semiconductor chip is flip-chip-mounted on the uppermost wiring layer;

the second wiring structure has a higher wiring density than the first wiring structure; and the second through holes each include an upper open end and a lower open end, wherein the upper open end has a smaller open width than the lower open end.

8. The wiring substrate according to claim 1, wherein the upper open end of each of the second through holes is located at a middle portion of the second insulation layer in the thickness-wise direction, and the lower open end of each of the second through holes is located at a lower surface of the second insulation layer.

9. The semiconductor device according to claim 7, wherein the upper open end of each of the second through holes is located at a middle portion of the second insulation layer in the thickness-wise direction, and the lower open end of each of the second through holes is located at a lower surface of the second insulation layer.

\* \* \* \* \*

UNITED STATES PATENT AND TRADEMARK OFFICE
CERTIFICATE OF CORRECTION

PATENT NO. : 9,859,201 B2
APPLICATION NO. : 14/730743
DATED : January 2, 2018
INVENTOR(S) : Noriyoshi Shimizu, Kiyoshi Oi and Yuichiro Shimizu Page 1 of 1

It is certified that error appears in the above-identified patent and that said Letters Patent is hereby corrected as shown below:

In the Claims

Column 29, Line 44, Claim 1, after "insulation" insert -- layer, --.

Column 29, Line 51, Claim 1, delete "layer;" and insert -- layer, --, therefor.

Column 30, Line 53, Claim 7, delete "herein" and insert -- wherein --, therefor.

Signed and Sealed this
Thirteenth Day of March, 2018

Andrei Iancu
*Director of the United States Patent and Trademark Office*